(12) United States Patent
Kawachi

(10) Patent No.: US 12,387,675 B2
(45) Date of Patent: Aug. 12, 2025

(54) DISPLAY DEVICE

(71) Applicant: XIAMEN TIANMA DISPLAY TECHNOLOGY CO., LTD., Xiamen (CN)

(72) Inventor: Genshiro Kawachi, Kanagawa (JP)

(73) Assignee: XIAMEN TIANMA DISPLAY TECHNOLOGY CO., LTD., Xiamen (CN)

( * ) Notice: Subject to any disclaimer, the term of this patent is extended or adjusted under 35 U.S.C. 154(b) by 0 days.

(21) Appl. No.: 18/322,955

(22) Filed: May 24, 2023

(65) Prior Publication Data

US 2023/0386410 A1    Nov. 30, 2023

(30) Foreign Application Priority Data

May 26, 2022  (JP) .................................. 2022-086125
Feb. 28, 2023  (JP) .................................. 2023-029818
May 2, 2023   (JP) .................................. 2023-076135

(51) Int. Cl.
*G09G 3/3233*    (2016.01)
*G09G 3/20*      (2006.01)
(Continued)

(52) U.S. Cl.
CPC ......... *G09G 3/3233* (2013.01); *G09G 3/2007* (2013.01); *G09G 3/32* (2013.01); *H01L 25/167* (2013.01); *H10D 86/481* (2025.01); *H10D 86/60* (2025.01); *H10K 59/1216* (2023.02); *G09G 2300/0852* (2013.01);
(Continued)

(58) Field of Classification Search
CPC . H01L 25/167; H01L 27/1255; G09G 3/3233; G09G 3/2007; G09G 3/32; G09G 2300/0852; G09G 2310/0202; G09G 2310/0262; G09G 2320/0626; G09G 2310/08; H10K 59/1216
See application file for complete search history.

(56) References Cited

U.S. PATENT DOCUMENTS

2016/0260373 A1*  9/2016  Miyake .................. G09G 3/2007
2019/0066587 A1*  2/2019  Han ....................... G09G 3/3258
(Continued)

FOREIGN PATENT DOCUMENTS

KR      20190078750 A      7/2019

*Primary Examiner* — Matthew A Eason
*Assistant Examiner* — Scott D Au
(74) *Attorney, Agent, or Firm* — NIXON & VANDERHYE

(57) ABSTRACT

Each pixel circuit includes a driving transistor, a first switching transistor and a second switching transistor. The driving transistor includes first and second gate electrodes. The first switching transistor is connected to a first data line and the first gate electrode, and controlled to be ON or OFF in accordance with a scanning signal supplied to a scanning line. The second switching transistor is connected to a second data line and the second gate electrode, and controlled to be ON or OFF in accordance with the scanning signal supplied to the scanning line. The voltage of the second data signal varies in the opposite direction to variation of voltage of the first data signal for at least a part of a gray scale range of the light-emitting element including the lowest gray scale level from the lowest gray scale level to the highest gray scale level.

18 Claims, 28 Drawing Sheets

(51) Int. Cl.
*G09G 3/32* (2016.01)
*H01L 25/16* (2023.01)
*H10D 86/40* (2025.01)
*H10D 86/60* (2025.01)
*H10K 59/121* (2023.01)

(52) U.S. Cl.
CPC ............... *G09G 2310/0202* (2013.01); *G09G 2310/0262* (2013.01); *G09G 2310/08* (2013.01); *G09G 2320/0626* (2013.01)

(56) References Cited

U.S. PATENT DOCUMENTS

| | | |
|---|---|---|
| 2020/0126485 A1 | 4/2020 | Moon et al. |
| 2020/0219446 A1* | 7/2020 | Yoshida ............... G09G 3/3291 |
| 2021/0027709 A1 | 1/2021 | Nishiyama |
| 2021/0049958 A1* | 2/2021 | Kim ...................... G09G 3/325 |
| 2021/0201790 A1* | 7/2021 | Gai ....................... G09G 3/3233 |
| 2021/0210012 A1* | 7/2021 | Zhang ................... G09G 3/3233 |
| 2024/0005857 A1* | 1/2024 | Gao ....................... G09G 3/3233 |

\* cited by examiner

RELATION BETWEEN Vdata1 AND Vdata2

CONFIGURATION OF DATA DRIVER

DISPLAY REGION OF MICRO-LED DISPLAY DEVICE

DISPLAY DEVICE

CROSS-REFERENCE TO RELATED APPLICATIONS

This non-provisional application claims priority under 35 U.S.C. § 119(a) on Patent Application No. 2022-86125 filed in Japan on May 26, 2022, Patent Application No. 2023-29818 filed in Japan on Feb. 28, 2023 and Patent Application No. 2023-76135 filed in Japan on May 2, 2023, the entire contents of which are hereby incorporated by reference.

BACKGROUND

This disclosure relates to a display device.

An organic light-emitting diode (OLED) element is a current-driven light-emitting element and therefore, does not need a backlight. In addition to this, the OLED element has advantages for achievement of low power consumption, wide viewing angle, and high contrast ratio; it is expected to contribute to development of flat panel display devices.

An active-matrix (AM) OLED display device includes transistors for selecting pixels and driving transistors for supplying electric current to the pixels. The transistors in an OLED display device are thin-film transistors (TFTs); commonly, low-temperature polysilicon (LTPS) TFTs and/or oxide semiconductor TFTs are used. For middle to large-sized OLED display devices such as monitors for industrial use, PC monitors, and TV monitors, backplanes including oxide semiconductor TFTs are more frequently employed because the array process can be performed under low temperature on a large mother glass.

SUMMARY

An aspect of this disclosure is a display device comprising: a display panel; and a control circuit configured to control the display panel, wherein the display panel includes: a plurality of light-emitting elements and a plurality of pixel circuits, each pixel circuit being configured to control light emission of a light-emitting element; first data lines to supply first data signals to the plurality of pixel circuits; second data lines to supply second data signals to the plurality of pixel circuits; and scanning lines to control the plurality of pixel circuits, wherein each pixel circuit is connected to one or more scanning lines and includes: a driving transistor including a first gate electrode facing a semiconductor layer across a first gate insulating layer and a second gate electrode facing the semiconductor layer across a second gate insulating layer, the driving transistor being configured to control driving current to be supplied to the light-emitting element; a first switching transistor connected to a first data line and the first gate electrode, the first switching transistor being controlled to be ON or OFF in accordance with a scanning signal supplied to a scanning line; and a second switching transistor connected to a second data line and the second gate electrode, the second switching transistor being controlled to be ON or OFF in accordance with the scanning signal supplied to the scanning line, and wherein the control circuit is configured to: supply a first data signal to the first gate electrode through the first data line when the first switching transistor is ON and subsequently turn off the first switching transistor; supply a second data signal to the second gate electrode through the second data line when the second switching transistor is ON and subsequently turn off the second switching transistor; and control the first data signal and the second data signal supplied to each pixel circuit in such a manner that voltage of the second data signal varies depending on voltage of the first data signal according to a predetermined relationship between the first and second data signal.

An aspect of this disclosure is a display device including: a display panel; and a control circuit configured to control the display panel, wherein the display panel includes: a plurality of light-emitting elements and a plurality of pixel circuits, each pixel circuit being configured to control light emission of a light-emitting element; data lines to supply first data signals and second data signals to the plurality of pixel circuits; and first scanning lines and second scanning lines to control the plurality of pixel circuits, wherein each pixel circuit includes: a driving transistor including a first gate electrode facing a semiconductor layer across a first gate insulating layer and a second gate electrode facing the semiconductor layer across a second gate insulating layer, the driving transistor being configured to control driving current to be supplied to the light-emitting element; a first switching transistor connected to a data line and the first gate electrode, the first switching transistor being controlled to be ON or OFF in accordance with a first scanning signal supplied to a first scanning line; and a second switching transistor connected to the data line and the second gate electrode, the second switching transistor being controlled to be ON or OFF in accordance with a second scanning signal supplied to a second scanning line, and wherein the control circuit is configured to: supply a first data signal to the first gate electrode through the data line when the first switching transistor is ON and subsequently turn off the first switching transistor; supply a second data signal to the second gate electrode through the data line when the second switching transistor is ON and subsequently turn off the second switching transistor; and control the first data signal and the second data signal supplied to each pixel circuit in such a manner that voltage of the second data signal varies depending on voltage of the first data signal according to a predetermined relationship between the first and second data signal.

An aspect of this disclosure is a display device comprising: a display panel; and a control circuit configured to control the display panel, wherein the display panel includes a plurality of light-emitting elements and a plurality of pixel circuits, each pixel circuit being configured to control light emission of a light-emitting element, wherein each pixel circuit includes a driving transistor configured to control driving current to be supplied to a light-emitting element, wherein the driving transistor includes a first gate electrode facing a semiconductor layer across a first gate insulating layer and a second gate electrode facing the semiconductor layer across a second gate insulating layer, wherein the driving transistor is configured to control driving current to be supplied to the light-emitting element in a state where the first gate electrode is supplied with a first data signal and the second gate electrode is supplied with a second data signal, wherein the control circuit is configured to control each pixel circuit with a display mode selected from a plurality of display modes, wherein the plurality of display modes are defined by different relations between the first data signal and the second data signal and by different relations between the first data signal and a brightness level of the light-emitting element, and wherein the control circuit is configured to control the first data signal and the second data signal to generate the driving current of each pixel circuit.

It is to be understood that both the foregoing general description and the following detailed description are exemplary and explanatory and are not restrictive of this disclosure.

EMBODIMENTS

Figure 1:
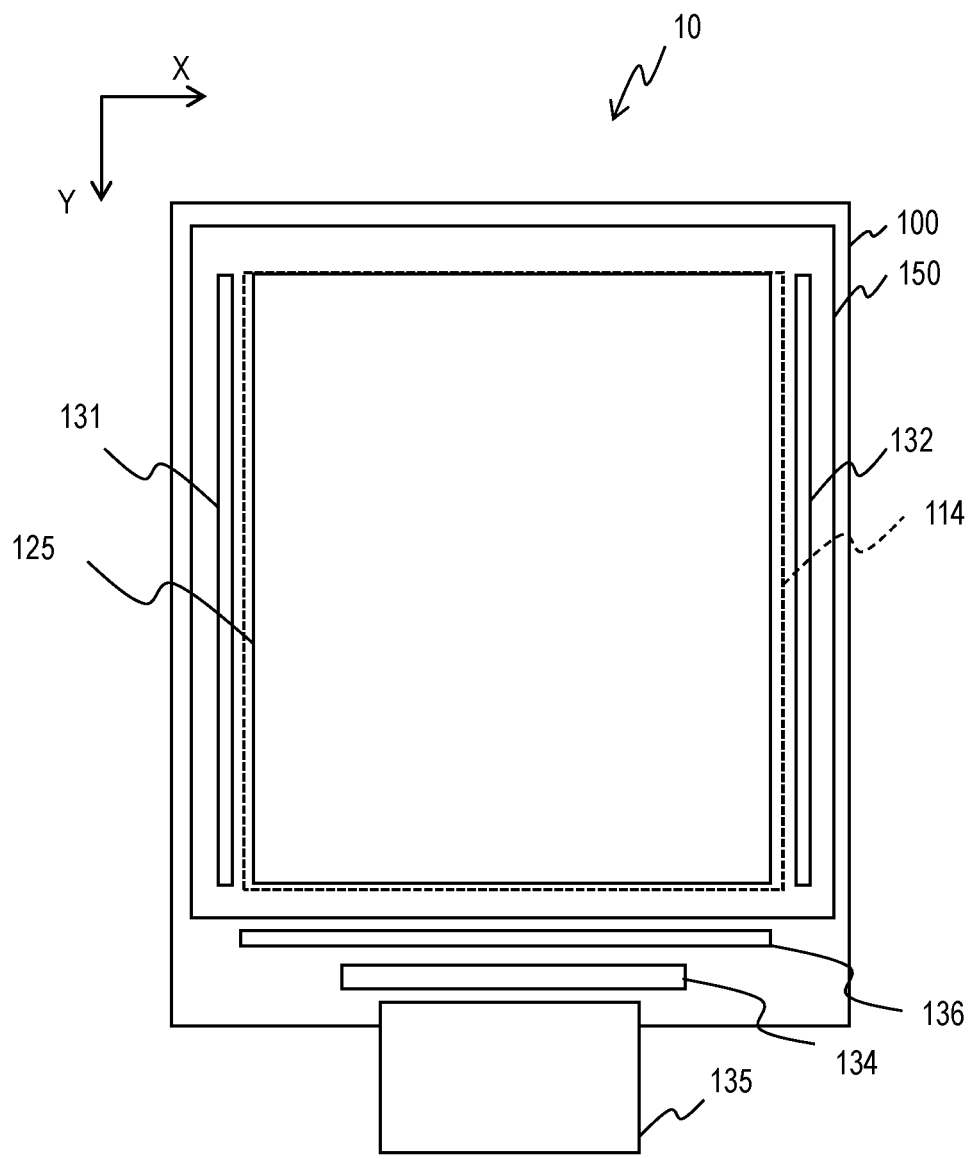
FIG. 1 schematically illustrates a configuration example of an OLED display device of a display device.

Hereinafter, embodiments will be described specifically with reference to the drawings. Elements common to the drawings are denoted by the same reference signs and some elements in the drawings are exaggerated in size or shape for clear understanding of the description.

Disclosed in the following are techniques to improve the control of lighting current for a light-emitting element in an electroluminescent display device. The electroluminescent display device is a display device utilizing light-emitting elements that emit light in response to lighting current, like an organic light-emitting diode (OLED) display device.

In an embodiment of this specification, driving transistors have a dual-gate structure. In other words, each driving transistor includes a first gate electrode and a second gate electrode sandwiching a channel region. Gate insulating layers are interposed between the first gate electrode and the channel region and between the second gate electrode and the channel region.

The driving transistor controls the brightness of the light to be emitted from a light-emitting element by supplying a lighting current corresponding to an emission level. The lighting current varies in accordance with the gate voltages of the first gate electrode and the second gate electrode of the driving transistor.

The control circuit of the display device supplies a first data signal (first gate voltage) to the first gate electrode and further, a second data signal (second gate voltage) to the second gate electrode. The first gate voltage is at a value corresponding to a desired gray scale level. Gray scale levels are associated with brightness levels of the light of the light-emitting element. A lower gray scale level is for darker light and a higher gray scale level is for brighter light.

The second data signal varies with variation of the first data signal for at least a part of the gray scale range (brightness range). The second data signal varying depending on the first data signal enables the subthreshold factor of the driving transistor to be controlled at an intended value.

An embodiment of this specification controls the first data signal and the second data signal supplied to each pixel circuit in such a manner that voltage of the second data signal varies depending on voltage of the first data signal according to a predetermined relationship between the first and second data signal. The second data signal changes in a different manner than the first data signal changes.

In an embodiment of this specification, the second data signal varies opposite in polarity to the first data signal. In other words, the second data signal decreases with increase of the first data signal and increases with decrease of the first data signal. In an embodiment of this specification, the part of the gray scale range is a continuous range from the lowest gray scale level to a first gray scale level higher than the lowest gray scale level (referred to as low-gray scale range). The first gray scale level may be the highest gray scale level, so that the second data signal varies opposite in polarity to the first data signal in the entire gray scale range. The first gray scale level may be a middle gray scale level between the lowest and the highest gray scale levels. In such case, the second data signal can be fixed or vary in the same polarity as the first data signal in the range higher than the first gray scale level.

The first data signal is expressed as Vdata1 and the second data signal as Vdata2. The data signals Vdata1 and Vdata2 for the low-gray scale range can have the following relation: Vdata2=V0+k×Vdata1, where V0 is a constant and k is a negative coefficient. The relation between Vdata1 and Vdata2 can be expressed by a function given in accordance with the design of the OLED display device.

Supplying a driving transistor having a dual-gate structure with gate voltages varying opposite in polarity increases the subthreshold factor of the driving transistor, enabling a lighting current more precisely corresponding to a gray scale level to be supplied to the light-emitting element. Especially, such control in the low-gray scale range increases the potential difference (voltage difference) between gray scale levels, facilitating the emission control in the low-gray scale range. Hence, the luminance MURA (unevenness) in display can be effectively reduced.

Oxide semiconductor thin-film transistors (TFTs) have smaller subthreshold factors than 0.2 V/decade, in general. For this reason, the above-described gate voltage control provides significant effects especially onto a pixel circuit employing an oxide semiconductor TFT as a driving transistor.

A driving transistor is required to keep holding the first data signal and the second data signal during one frame period or more. The pixel circuit in an embodiment of this specification includes a first switching transistor and a second switching transistor. The first switching transistor turns ON/OFF electric connection between the first gate electrode and the data line for transmitting the first data signal. The second switching transistor turns ON/OFF electric connection between the second gate electrode and the data line for transmitting the second data signal.

The data line for transmitting the first data signal and the data line for transmitting the second data signal can be the same one data line or different data lines. When the first switching transistor is in an ON-state, it supplies a first data signal from the data line to the first gate electrode. After supplying the first data signal, the first switching transistor is turned OFF. When the second switching transistor is in an ON-state, it supplies a second data signal from the data line to the second gate electrode. After supplying the second data signal, the second switching transistor is turned OFF.

As a result, the first data signal and the second data signal are held at the first gate electrode and the second gate electrode for one frame period. The display device selects pixel rows one after another and writes data signals to all pixel rows within one frame. The display device holds the data signals in all pixel rows to keep the displayed image until writing the next data signals. The data signals for displaying an image are generated based on a frame of video data received from an external.

The method of controlling a driving transistor having a dual-gate structure and a pixel circuit including such a driving transistor are applicable to display devices including light-emitting elements of different kinds other than OLED elements.

Configuration of Display Device

FIG. 1 schematically illustrates a configuration example of an OLED display device 10 of a display device. The horizontal direction in FIG. 1 is an X-axis direction and the vertical direction is a Y-axis direction, which is perpendicular to the X-axis direction. The OLED display device 10 includes a thin-film transistor (TFT) substrate 100 on which OLED elements (light-emitting elements) are fabricated and an encapsulation substrate 150 for encapsulating the OLED elements.

The space between the TFT substrate 100 and the encapsulation substrate 150 is filled with an inactive gas such as dry nitrogen and sealed up. In place of the encapsulation substrate 150, a structural encapsulation unit having a different structure, such as a structural encapsulation unit utilizing thin-film encapsulation, can be employed.

In the periphery of a cathode electrode region 114 outer than the display region 125 of the TFT substrate 100, scanning circuits 131 and 132, a driver IC 134, and a demultiplexer 136 are provided. The driver IC 134 is connected to the external devices via flexible printed circuits (FPC) 135. The scanning circuits 131 and 132 drive scanning lines on the TFT substrate 100.

The driver IC 134 is mounted with an anisotropic conductive film (ACF), for example. The driver IC 134 provides power and timing signals (control signals) to the scanning circuits 131 and 132 and further, provides a data signal to the demultiplexer 136.

The demultiplexer 136 outputs output of one pin of the driver IC 134 to d data lines in turn (d is an integer greater than 1). The demultiplexer 136 changes the output data line for the data signal from the driver IC 134 $d$ times per scanning period to drive d times as many data lines as output pins of the driver IC 134.

The display region 125 includes a plurality of OLED elements and a plurality of pixel circuits for controlling light emission of the plurality of OLED elements. In an example of a color OLED display device, each OLED element emits light in one of the colors of red, blue, and green. The plurality of pixel circuits constitute a pixel circuit array. The plurality of OLED elements and the plurality of pixel circuits are disposed in a matrix, for example.

As will be described later, each pixel circuit includes a driving TFT (driving transistor) having a dual-gate structure and two switching transistors each connected between one of the two gate electrodes of the driving TFT and a common or different data line. Each of the two switching transistors is turned ON/OFF so that a data signal will be supplied to the associated gate electrode and held at the gate electrode for one frame. The data signals (gate voltages) at the two gate electrodes change the conductance of the driving TFT in an analog manner to supply a forward bias current corresponding to the gray scale level to the OLED element.

Configuration of Pixel Circuit

Figure 2:
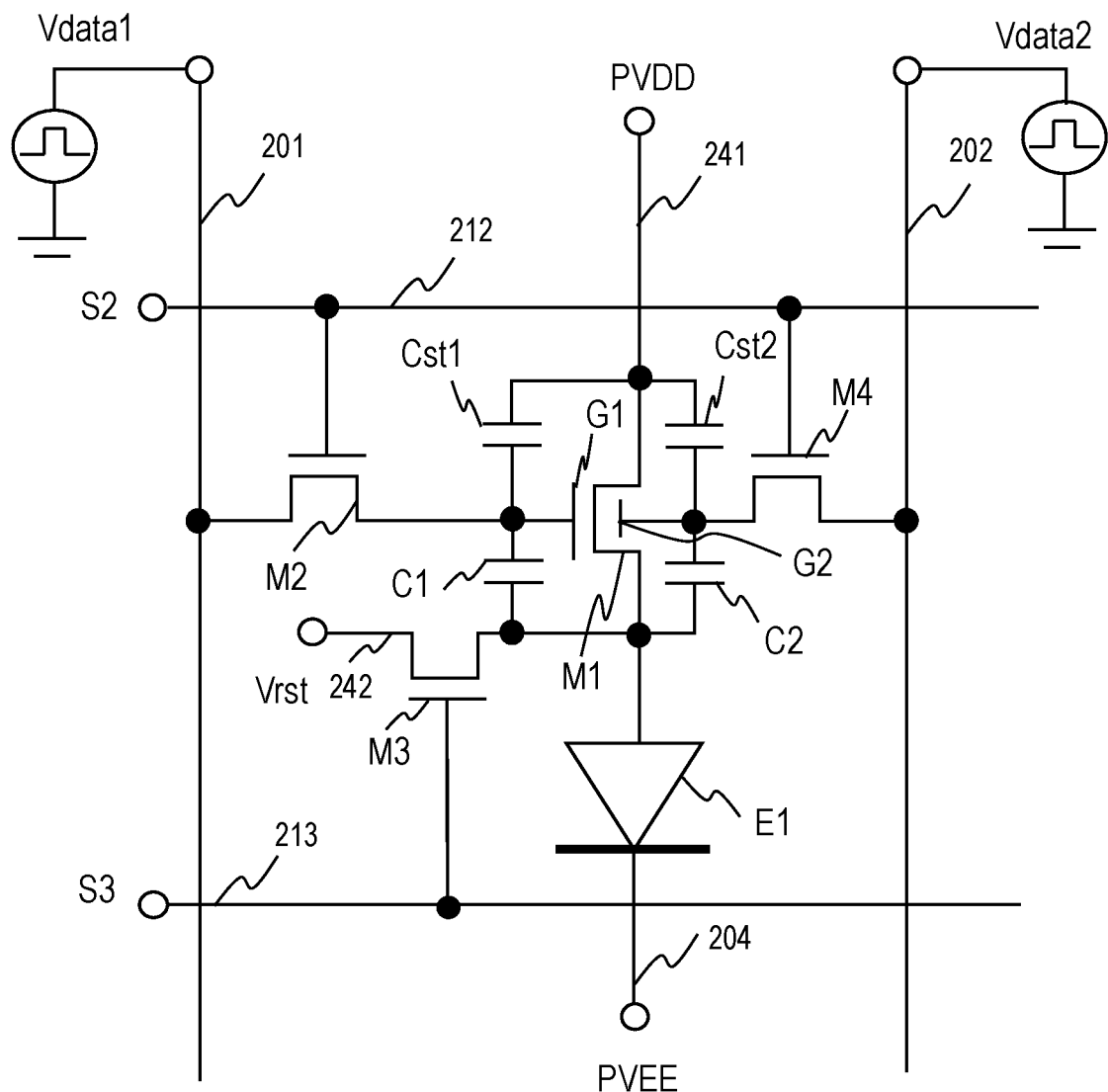
FIG. 2 illustrates a configuration example of a pixel circuit and control signals therefor in an embodiment of this specification.

FIG. 2 illustrates a configuration example of a pixel circuit and control signals therefor in an embodiment of this specification. The pixel circuit is included in the l-th pixel circuit row (l is an integer). The pixel circuit includes four transistors (TFTs) M1 to M4 each having a gate electrode, a source region, and a drain region. All transistors M1 to M4 in this example are n-type TFTs. The n-type TFTs can be oxide semiconductor TFTs.

The transistor M1 is a driving transistor for controlling the amount of lighting current for an OLED element E1. The transistor M1 has a dual-gate structure including a first gate electrode G1 and a second gate electrode G2. The drain region of the driving transistor M1 is connected to a power line 241 for transmitting a positive power supply potential PVDD. The driving transistor M1 controls the amount of lighting current to be supplied from the power line 241 to the OLED element E1 in accordance with the gate voltages at the gate electrodes G1 and G2.

The pixel circuit includes storage capacitive elements Cst1 and Cst2. The storage capacitive element Cst1 is a third capacitive element and it is connected between the power line 241 for transmitting the positive power supply potential PVDD and the first gate electrode G1 of the driving transistor M1. The storage capacitive element Cst1 holds the voltage between the first gate electrode G1 of the driving transistor M1 and the power line 241. The drain region of the driving transistor M1 is connected to the power line 241 and the drain potential is the positive power supply potential PVDD.

The gate voltage of the first gate electrode G1 is maintained by the charge stored in the storage capacitive element Cst1 and the gate capacitor of the first gate electrode G1. The gate voltage of the first gate electrode G1 is at a value depending on a first data signal Vdata1 transmitted by a first data line 201. The storage capacitive element Cst1 can be excluded depending on the design.

The storage capacitive element Cst2 is a fourth capacitive element, which is connected between the power line 241 for transmitting the positive power supply potential PVDD and the second gate electrode G2 of the driving transistor M1. The storage capacitive element Cst2 holds the voltage between the second gate electrode G2 of the driving transistor M1 and the power line 241.

The gate voltage of the second gate electrode G2 is maintained by the charge stored in the storage capacitive element Cst2 and the gate capacitor of the second gate electrode G2. The gate voltage of the second gate electrode G2 is at a value depending on a second data signal Vdata2 transmitted by a second data line 202. In an embodiment of this specification, the capacitance and the area of the storage capacitive element Cst2 are smaller than those of the storage capacitive element Cst1. This configuration facilitates the implementation of a pixel circuit while attaining appropriate control of the driving transistor M1. The storage capacitive element Cst2 can be excluded depending on the design.

The transistor M2 is a first switching transistor for selecting the pixel circuit to be supplied with the first data signal Vdata1 and applying the first data signal (voltage) Vdata1 to the first gate electrode G1. One of the source/drain regions (the source region or the drain region) of the transistor M2 is connected to a node between the first gate electrode G1 and the first storage capacitive element Cst1 and the other source/drain region is connected to the data line 201 for transmitting the first data signal Vdata1.

The gate electrode of the transistor M2 is connected to a transmission line 212 for transmitting a selection signal S2 from the scanning circuit 131. The transistor M2 is controlled by the selection signal S2. When the transistor M2 is ON, the transistor M2 supplies the first data signal Vdata1 supplied from the driver IC 134 through the data line 201 to the first gate electrode G1 and the first storage capacitive element Cst1.

The transistor M4 is a second switching transistor for selecting the pixel circuit to be supplied with the second data signal Vdata2 and applying the second data signal (voltage) Vdata2 to the second gate electrode G2. One of the source/drain regions of the transistor M4 is connected to a node between the second gate electrode G2 and the second storage capacitive element Cst2 and the other source/drain region is connected to the data line 202 for transmitting the second data signal Vdata2.

The gate electrode of the transistor M4 is connected to the transmission line 212 for transmitting the selection signal S2 from the scanning circuit 131. The transistor M4 is controlled by the selection signal S2. When the transistor M4 is ON, the transistor M4 supplies the second data signal Vdata2 supplied from the driver IC 134 through the data line 202 to the second gate electrode G2 and the second storage capacitive element Cst2.

The cathode of the OLED element E1 is connected to a power line 204 for supplying a cathode power supply potential PVEE. In the example of FIG. 2, the anode of the OLED element E1 is connected to the source region of the driving transistor M1. The transistor M3 works to supply a reset potential Vrst to the source region of the driving transistor M1 and the anode of the OLED element E1.

One of the source/drain regions of the transistor M3 is connected to a power line 242 for transmitting the reset potential Vrst and the other source/drain region is connected to the source region of the driving transistor M1 and the anode of the OLED element E1. The reset potential Vrst can be equal to or lower than the cathode power supply potential PVEE. In the case where these potentials are equal (for example, at the ground potential), a transmission line (power line) can be shared between the reset potential Vrst and the cathode power supply potential PVEE. The cathode power supply potential PVEE can be referred to as negative power supply potential, in comparison to the positive power supply potential PVDD.

The gate electrode of the transistor M3 is connected to a control signal line 213 for transmitting a selection signal S3 and the transistor M3 is controlled by the selection signal S3. When the transistor M3 is turned ON by the selection signal S3 from the scanning circuit 131, the transistor M3 supplies the reset potential Vrst transmitted by the power line 242 to the source region of the driving transistor M1 and the anode of the OLED element E1.

The pixel circuit includes capacitive elements C1 and C2. The capacitances and the areas of these capacitive elements can be equal. The capacitive element C1 is a first capacitive element and it is connected between the first gate electrode G1 and the source region of the driving transistor M1. The capacitive element C2 is a second capacitive element and it is connected between the second gate electrode G2 and the source region of the driving transistor M1.

As described above, the source region of the driving transistor M1 is temporarily charged to the reset potential Vrst. When the OLED element E1 is emitting light, the source potential of the driving transistor M1 increases to a potential VA determined by the value of the lighting current (driving current). Accordingly, the variation in potential (VA−Vrst) is added to the gate potential of the driving transistor M1 through the capacitive elements C1 and C2 (bootstrapping), achieving constant-current operation of the driving transistor M1.

Structure of Driving Transistor

Figure 3:
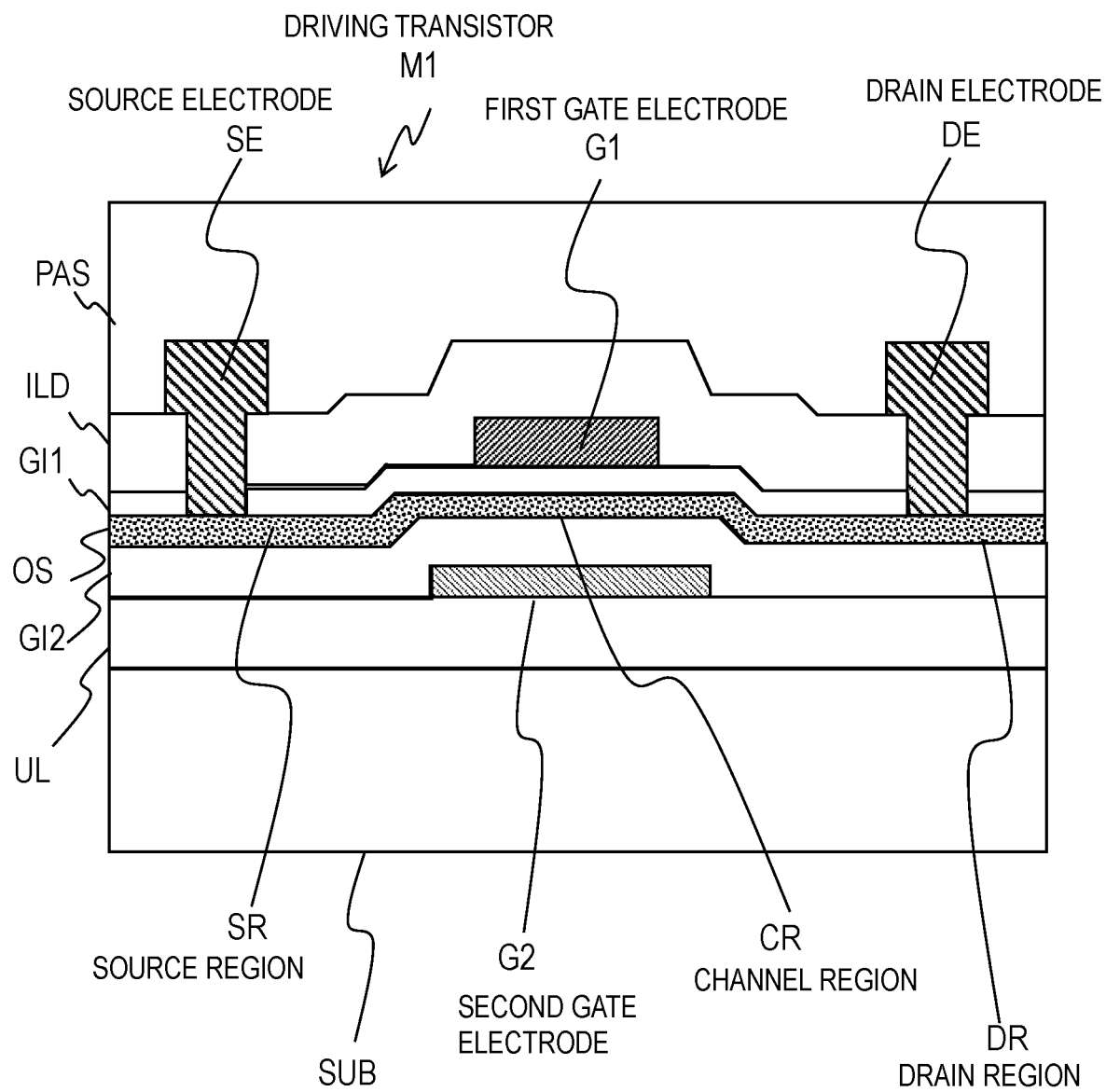
FIG. 3 is a cross-sectional diagram schematically illustrating the cross-sectional structure of a driving transistor.

FIG. 3 is a cross-sectional diagram schematically illustrating the cross-sectional structure of a driving transistor M1. An undercoat layer UL is laid above an insulating substrate SUB and the driving transistor M1 is fabricated thereon. In this specification, the side farther from the substrate is referred to as upper side, the side closer to the substrate as lower side.

The driving transistor M1 includes a second gate electrode G2 and a gate insulating layer G12 located between the second gate electrode G2 and an oxide semiconductor layer OS. The second gate electrode G2 is a bottom-gate electrode. The gate insulating layer G12 is also referred to as second gate insulating layer or bottom-gate insulating layer. The oxide semiconductor layer OS is made of a metal oxide.

The oxide semiconductor layer OS includes a source region SR, a drain region DR, and a channel region CR located between the source region SR and the drain region DR in an in-plane direction. The second gate insulating layer GI2 can be a silicon oxide film or a stack of a silicon oxide film (upper side) and a silicon nitride film (lower side).

The oxide semiconductor layer OS is provided directly above (in contact with) the second gate insulating layer GI2. An example of the metal oxide is indium gallium zinc oxide (IGZO). The source region SR and the drain region DR are made of the metal oxide reduced in resistance. The channel region CR is made of the metal oxide (semiconductor) not reduced in resistance.

The second gate electrode G2 is opposed to the channel region CR across the second gate insulating layer GI2. The second gate electrode G2, the second gate insulating layer GI2, and the channel region CR are laid one above another in this order from the bottom (the side closer to the substrate). The second gate insulating layer GI2 is in contact with the channel region CR and the second gate electrode G2. The second gate electrode G2 is supplied with a signal voltage in accordance with the second data signal Vdata2.

The driving transistor M1 further includes a first gate electrode G1 and a gate insulating layer GI1 located between the first gate electrode G1 and the channel region CR in an in-plane direction. The first gate electrode G1 is a top-gate electrode. The gate insulating layer GI1 is also referred to as first gate insulating layer or top-gate insulating layer.

The first gate insulating layer GI1 can be a silicon oxide film, a silicon nitride film, or a stack of these films. The channel region CR, the first gate insulating layer GI1, and the first gate electrode G1 are laid one above another in this order from the bottom (the side closer to the substrate). The first gate insulating layer GI1 is in contact with the channel region CR and the first gate electrode G1.

The first gate electrode G1 is supplied with a signal voltage in accordance with the first data signal Vdata1. The first gate electrode G1 can be used as a mask for producing the source region SR and the drain region DR (self-alignment). The first gate electrode G1 also blocks the external light to the channel region CR.

The first gate electrode G1 and the layers lower than that are covered with an interlayer insulating layer ILD and a passivation layer PAS above the interlayer insulating layer ILD. The interlayer insulating layer ILD and the passivation layer PAS are insulating layers. A source electrode SE extends through the interlayer insulating layer ILD and the first gate insulating layer GI1 and is in contact with the source region SR. A drain electrode DE extends through the interlayer insulating layer ILD and the first gate insulating layer GI1 and is in contact with the drain region DR.

Operation of Pixel Circuit

Figure 4:
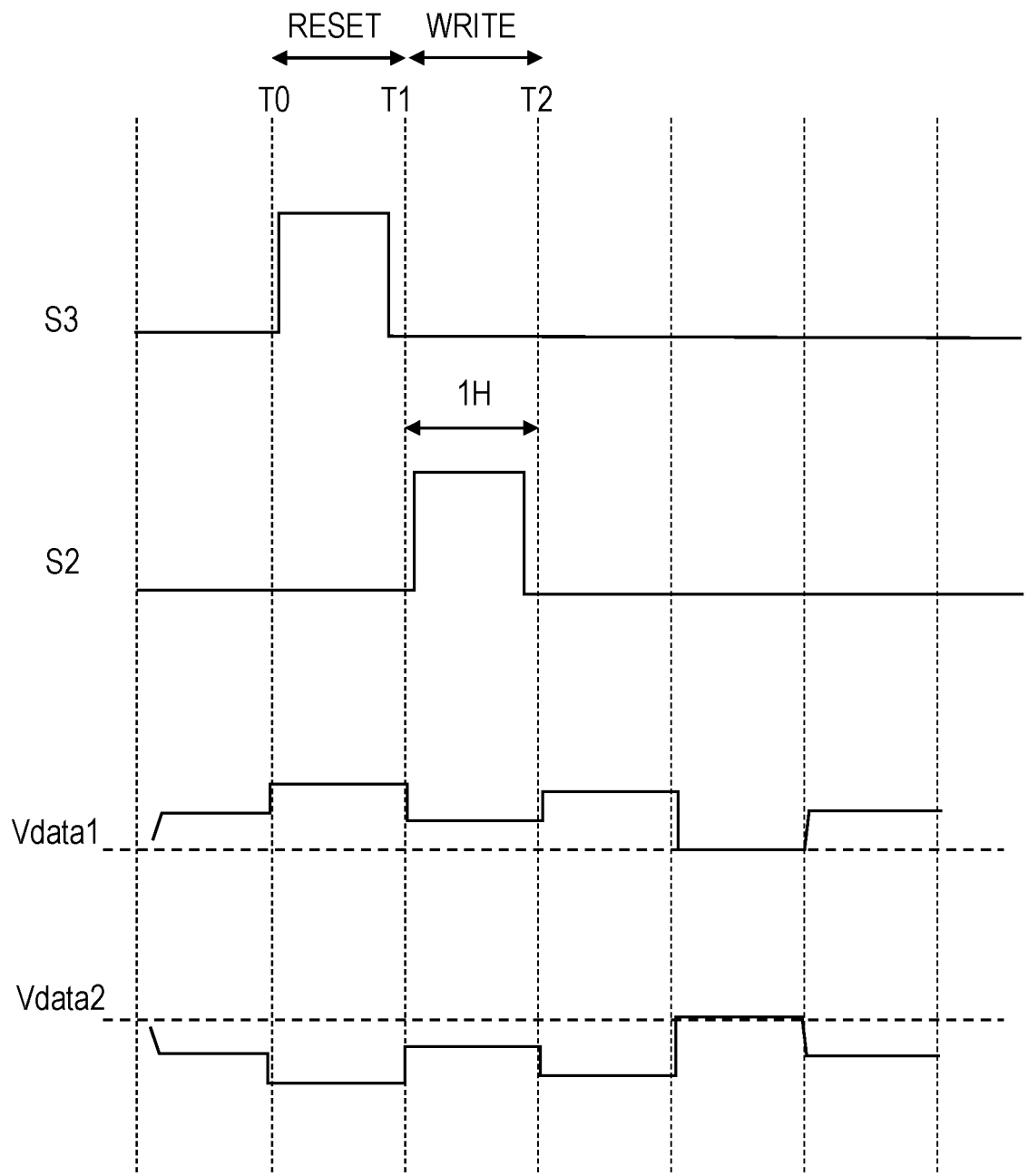
FIG. 4 is a timing chart of the signals for controlling the pixel circuit illustrated in FIG. 2.

FIG. 4 is a timing chart of the signals for controlling the pixel circuit illustrated in FIG. 2. FIG. 4 is a timing chart for selecting the l-th row and writing data signals to a pixel circuit therein. Specifically, FIG. 4 illustrates timing of the selection signal S2, the selection signal S3, the first data signal Vdata1, and the second data signal Vdata2. The intervals between vertical dotted lines are equal and each interval represents 1H period.

The period prior to a time T0 is an emission period. The selection signals S2 and S3 are Low. During this period, the transistors M2 to M4 are OFF. Accordingly, the gate voltages of the first gate electrode G1 and the second gate electrode G2 are maintained. A constant lighting current in accordance with the levels of the data signals is supplied from the power line 241 to the OLED element E1 through the driving transistor M1, so that the OLED element E1 emits light.

The period from the time T0 to a time T1 is a reset period. Immediately after the time T0, the selection signal S3 changes from Low to High. The selection signal S2 remains Low. In response to the change of the selection signal S3, the transistor M3 turns ON. The transistors M2 and M4 remain OFF. Since the transistor M3 is ON, the source region of the driving transistor M1 and the anode of the OLED element E1 are reset to the reset potential Vrst.

Immediately before the time T1, the selection signal S3 changes from High to Low and the transistor M3 turns OFF. The selection signal S2 changes from Low to High immediately after the time T1. In response to the change of the selection signal S2, the transistors M2 and M4 turn ON.

The first data signal Vdata1 is supplied to the first gate electrode G1 via the transistor M2 in an ON-state. Simultaneously, the second data signal Vdata2 is supplied to the second gate electrode G2 via the transistor M4 in an ON-state. The first data signal Vdata1 and the second data signal Vdata2 change to the voltages for the associated pixel rows with a cycle of 1H. As described above, the first data signal Vdata1 and the second data signal Vdata2 vary opposite in polarity for each pixel.

Figure 5:
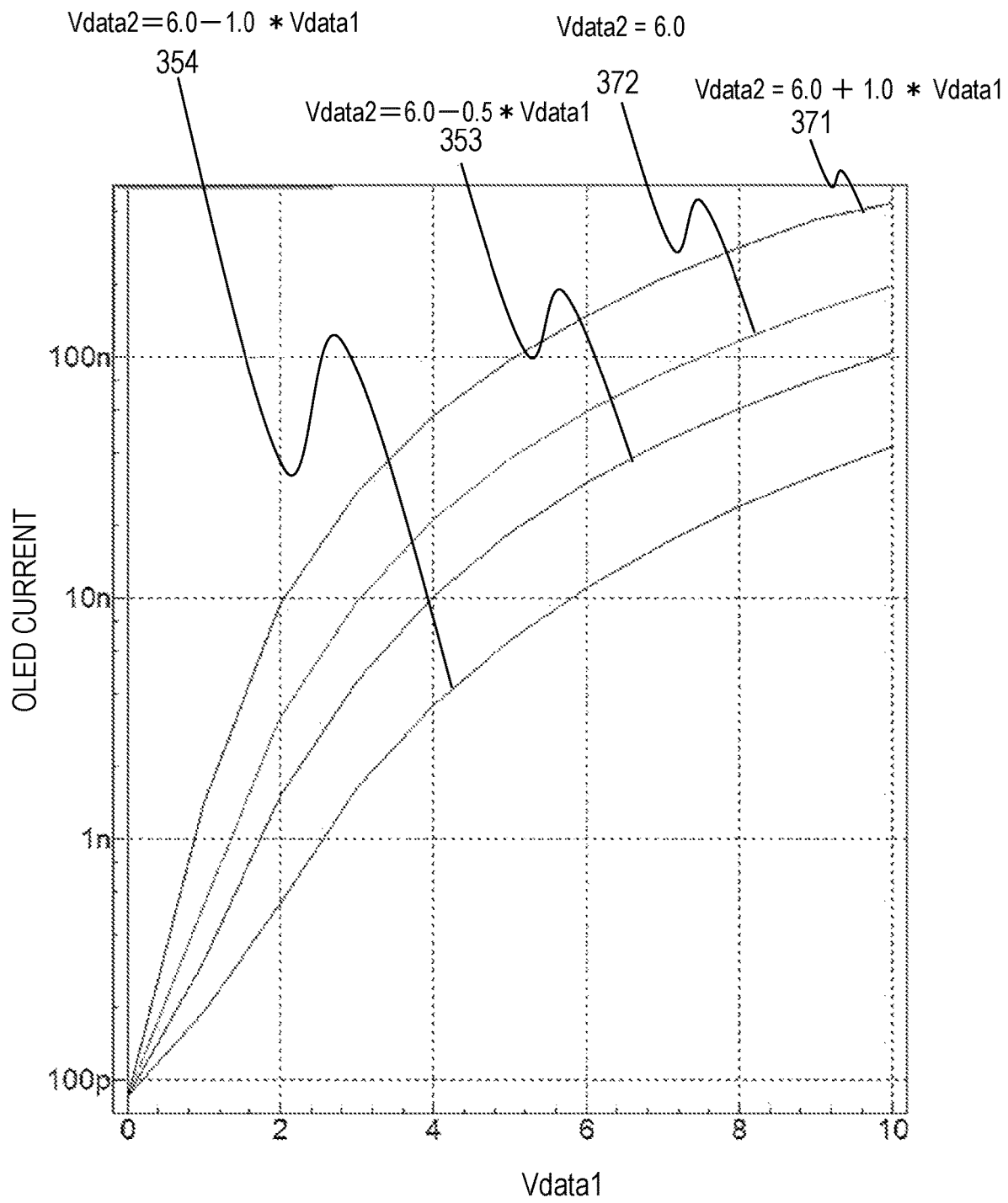
FIG. 5 provides simulation results on the relation between a first data signal Vdata1 and the lighting current supplied from a driving transistor to an OLED element when different second data signals Vdata2 are supplied.

FIG. 5 provides simulation results on the relation between the first data signal Vdata1 and the lighting current supplied from the driving transistor M1 to the OLED element E1 when different second data signals Vdata2 are supplied. The horizontal axis of the graph represents the first data signal Vdata1 and the vertical axis represents the log value of the lighting current.

The curve 371 represents the relation between the first data signal Vdata1 and the lighting current in the case where the second data signal Vdata2=6.0+Vdata1. The curve 372 represents the relation between the first data signal Vdata1 and the lighting current in the case where the second data signal Vdata2=6.0. The curve 353 represents the relation between the first data signal Vdata1 and the lighting current in the case where the second data signal Vdata2=6.0−0.5*Vdata1. The curve 354 represents the relation between the first data signal Vdata1 and the lighting current in the case where the second data signal Vdata2=6.0−Vdata1.

In the examples provided in FIG. 5, the second data signal Vdata2 in each curve is given by V0+k*Vdata1, where V0 is 6.0 and k is a value specific to the curve. As the value of k becomes smaller, the gradient of the curve becomes less steep, in other words, the threshold voltage Vth of the driving transistor becomes higher and the subthreshold factor (S-factor) becomes larger. As noted from these simulation results, a second data signal Vdata2 having characteristics that depend on the level of the first data signal Vdata1 and raise the threshold voltage Vth can increase the S-factor of the driving transistor. The S-factor can be controlled by the proportionality coefficient k, for which any value optimum for display performance can be selected.

Device Structure of Pixel Circuit

Figure 6:
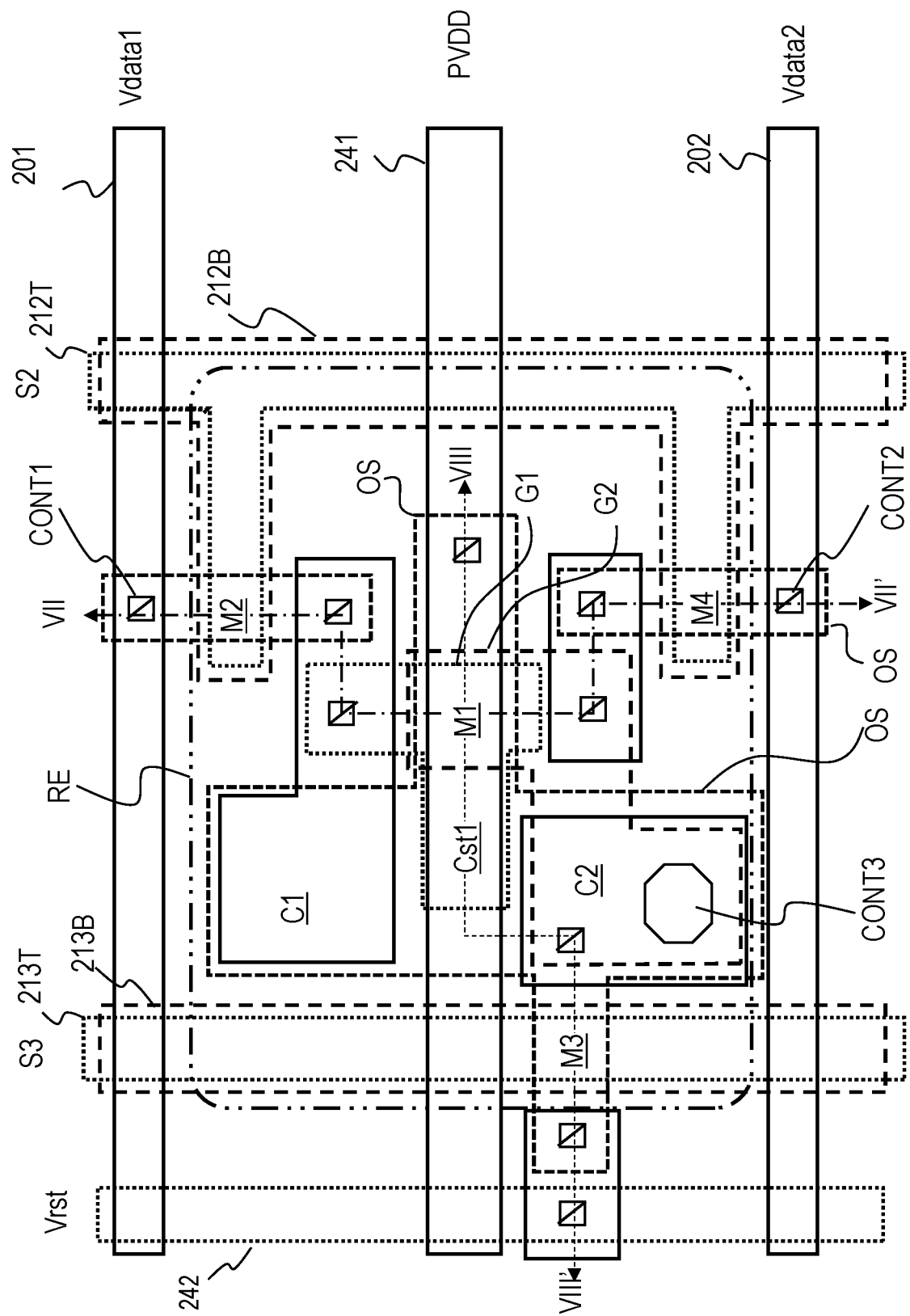
FIG. 6 is a plan diagram schematically illustrating the planar structure of a device of the pixel circuit illustrated in FIG. 2 when the device is viewed in the layering direction.

FIG. 6 is a plan diagram schematically illustrating the planar structure of a device of the pixel circuit illustrated in FIG. 2 when the device is viewed in the layering direction. The storage capacitive element Cst2 is omitted from FIG. 6. The transistors M2, M3, and M4 have a dual-gate structure; the top-gate electrode and the bottom-gate electrode of each transistor are supplied with the same control signal.

FIG. 6 illustrates the oxide semiconductor layer OS and the conductor layers in the pixel circuit. The squares with slash represent contact regions of different conductor layers.

A contact region is a conductive region provided in a via hole extending through one or more insulating layers in the layering direction. Elements made of the same material included in the pattern of the same layer are denoted by the same kind of lines.

The transmission lines 212T and 212B are to transmit the selection signal S2. The transmission lines 213T and 213B are to transmit the selection signal S3. The first data line 201 is to transmit the first data signal Vdata1 and the second data line 202 is to transmit the second data signal Vdata2. The power line 241 is to transmit the positive power supply potential PVDD and the power line 242 is to transmit the reset potential Vrst.

As described with reference to FIG. 2, the pixel circuit includes transistors M1 to M4. The semiconductor layers of these transistors are parts of the oxide semiconductor layer OS. As described above, the driving transistor M1 includes a first gate electrode G1 and a second gate electrode G2. The second gate electrode G2 and the transmission lines 212B and 213B are included in the pattern of the first metal layer. The first gate electrode G1, the transmission lines 212T and 213T, and the power line 242 are included in the pattern of the second metal layer. The data lines 201 and 202 and the power line 241 are included in the pattern of the third metal layer. The metal layers are laid in the order of the first meatal layer, the second metal layer, and the third metal layer from the side closer to the insulating substrate.

The contact region CONT1 is a contact region between one of the source/drain regions of the transistor M2 and the first data line 201. The contact region CONT2 is a contact region between one of the source/drain regions of the transistor M4 and the second data line 202. The contact region CONT3 is a contact region between the anode electrode RE of the OLED element and the pixel circuit. The anode electrode RE is located upper than the third metal layer.

Figure 7:
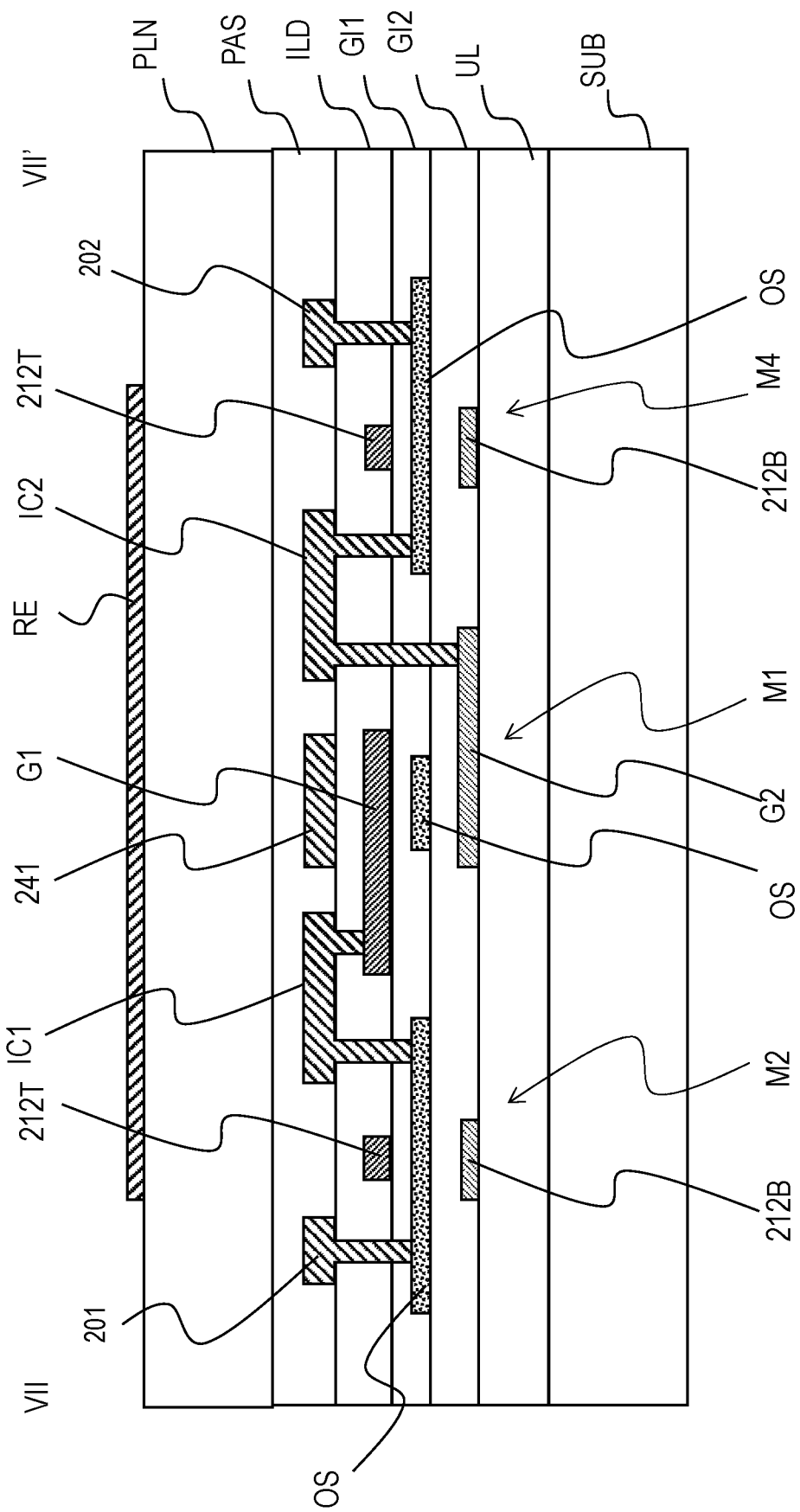
FIG. 7 schematically illustrates the cross-sectional structure along the section line VII-VII' in FIG. 6.

FIG. 7 schematically illustrates the cross-sectional structure along the section line VII-VII' in FIG. 6. FIG. 7 mainly illustrates the transistors M1, M2, and M4. The layered structure of the pixel circuit is fabricated on the substrate SUB made of polyimide or glass. The undercoat layer UL, which can be a silicon nitride layer, is provided on the substrate SUB.

The first metal layer is laid above the undercoat layer UL. Specifically, the transmission line 212B for transmitting the selection signal S2 and the second gate electrode G2 of the driving transistor M1 are shown in FIG. 7. As illustrated in FIG. 7, parts of the transmission line 212B correspond to the bottom-gate electrodes of the transistors M2 and M4. The first metal layer can be made of a metal such as W, Mo, or Ta or an alloy thereof.

The gate insulating layer GI2 is laid to cover the first metal layer. The gate insulating layer GI2 can be made of silicon oxide or silicon nitride. The oxide semiconductor layer OS is laid above the gate insulating layer GI2. The oxide semiconductor layer OS includes source/drain regions reduced in resistance and highly-resistive channel regions each sandwiched by two source/drain regions. Further, the gate insulating layer GI1 is laid to cover the oxide semiconductor layer OS. The gate insulating layer GI1 can be made of silicon oxide or silicon nitride.

The second metal layer is laid above the gate insulating layer GI1. Specifically, the transmission line 212T for transmitting the selection signal S2 and the first gate electrode G1 of the driving transistor M1 are shown in FIG. 7. As illustrated in FIG. 7, parts of the transmission line 212T correspond to the top-gate electrodes of the transistors M2 and M4. The second metal layer can be made of a metal such as W, Mo, or Ta or an alloy thereof.

The interlayer insulating layer ILD is laid to cover the second metal layer. The interlayer insulating layer ILD can be made of silicon oxide or silicon nitride. The third metal layer is provided above the interlayer insulating layer ILD. The third metal layer can be a single Al layer or a multi-layered structure of Ti/Al/Ti.

The elements included in the third metal layer shown in FIG. 7 are the transmission line 201 for the first data signal Vdata1, the transmission line 202 for the second data signal Vdata2, and the power line 241. Moreover, FIG. 7 shows the interconnection region 101 between one of the source/drain regions of the transistor M2 and the first gate electrode G1 of the driving transistor M1 and the interconnection region 102 between one of the source/drain regions of the transistor M4 and the second gate electrode G2 of the driving transistor M1.

Each of the transmission lines 201 and 202 is in direct contact with the oxide semiconductor layer OS via a contact hole extending through the interlayer insulating layer ILD and the gate insulating layer GI1. The interconnection region 101 is in direct contact with the oxide semiconductor layer OS of the transistor M2 via a contact hole extending through the interlayer insulating layer ILD and the gate insulating layer GI1 and also in direct contact with the first gate electrode G1 of the driving transistor M1 via a contact hole extending through the interlayer insulating layer ILD.

The interconnection region 102 is in direct contact with the oxide semiconductor layer OS of the transistor M4 via a contact hole extending through the interlayer insulating layer ILD and the gate insulating layer GI1 and also in direct contact with the second gate electrode G2 of the driving transistor M1 via a contact hole extending through the interlayer insulating layer ILD and the gate insulating layers GI1 and GI2.

The passivation layer PAS and the planarization layer PLN above the passivation layer PAS are provided to cover the layers lower than those. These layers can be made of an organic or inorganic insulator. The anode electrode RE of the OLED element is provided above the planarization layer PLN. The anode electrode RE can have a structure of ITO/Ag/ITO or IZO/Ag/IZO.

Figure 8:
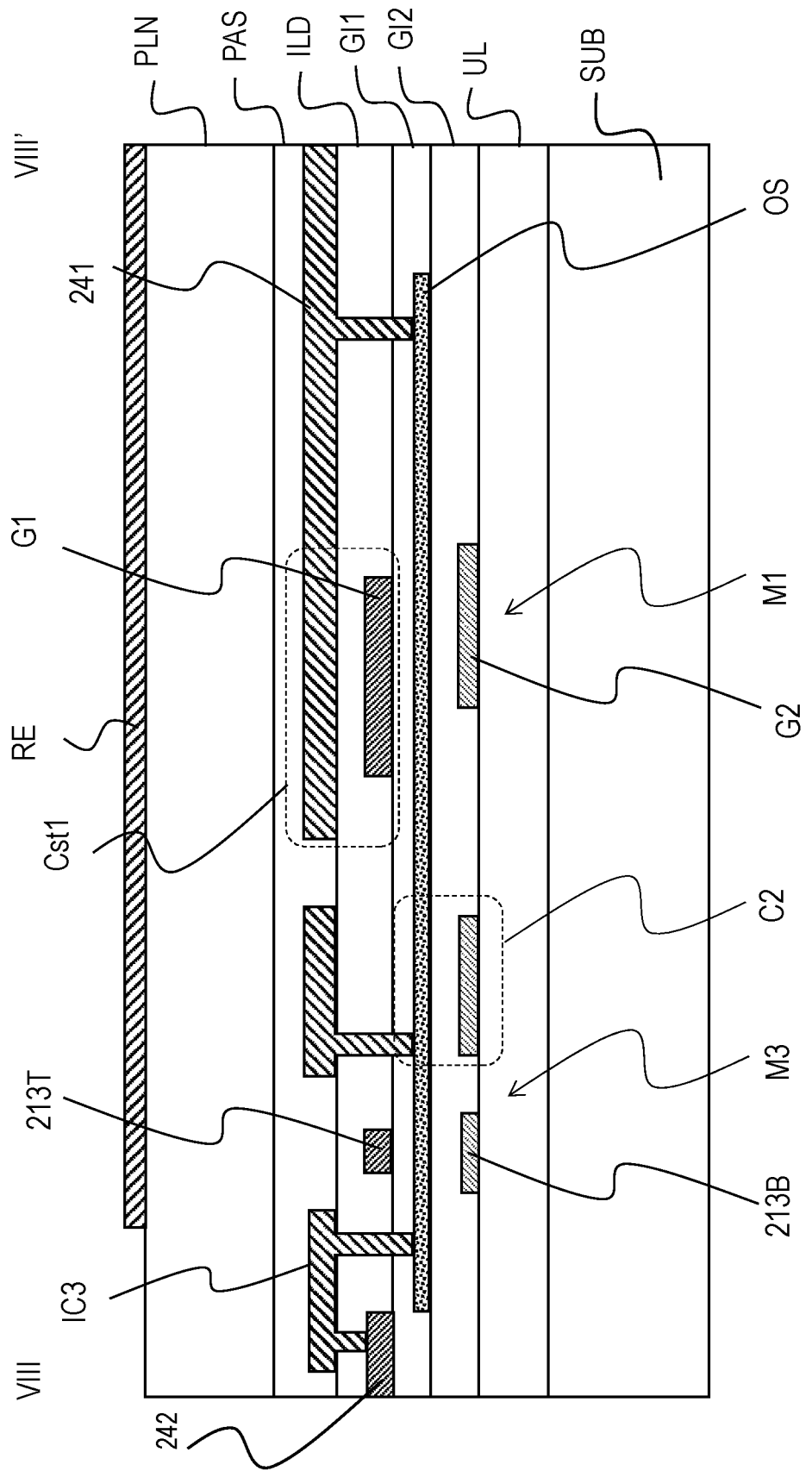
FIG. 8 schematically illustrates the cross-sectional structure along the section line VIII-VIII' in FIG. 6.

FIG. 8 schematically illustrates the cross-sectional structure along the section line VIII-VIII' in FIG. 6. FIG. 8 mainly illustrates the transistor M3, the capacitive element C2, the storage capacitive element Cst1, and the driving transistor M1. The following mainly describes the elements not shown in FIG. 7.

The first metal layer includes the transmission line 213B for transmitting the selection signal S3 and an electrode of the capacitive element C2. A part of the transmission line 213B corresponds to the bottom-gate electrode of the transistor M3. The capacitive element C2 is composed of the electrode in the first metal layer, one of the source/drain regions of the transistor M3, and the gate insulating layer GI2 therebetween.

The second metal layer includes the power line 242 for transmitting the reset potential Vrst and the transmission line 213T for transmitting the selection signal S3. A part of the transmission line 213T corresponds to the top-gate electrode of the transistor M3.

The third metal layer includes the interconnection region 103 between the power line 242 and a source/drain region of the transistor M3. The interconnection region 103 is in direct contact with the oxide semiconductor layer OS of the transistor M3 via a contact hole extending through the interlayer insulating layer ILD and the gate insulating layer GI1 and also in direct contact with the power line 242 via a contact hole extending through the interlayer insulating layer ILD.

A part of the power line 241 for the positive power supply potential corresponds to an electrode of the storage capacitive element Cst1. The storage capacitive element Cst1 is composed of the power line 241, the first gate electrode G1 of the driving transistor M1, and the interlayer insulating layer ILD therebetween.

Configuration Examples of Pixel Circuit

Figure 9:
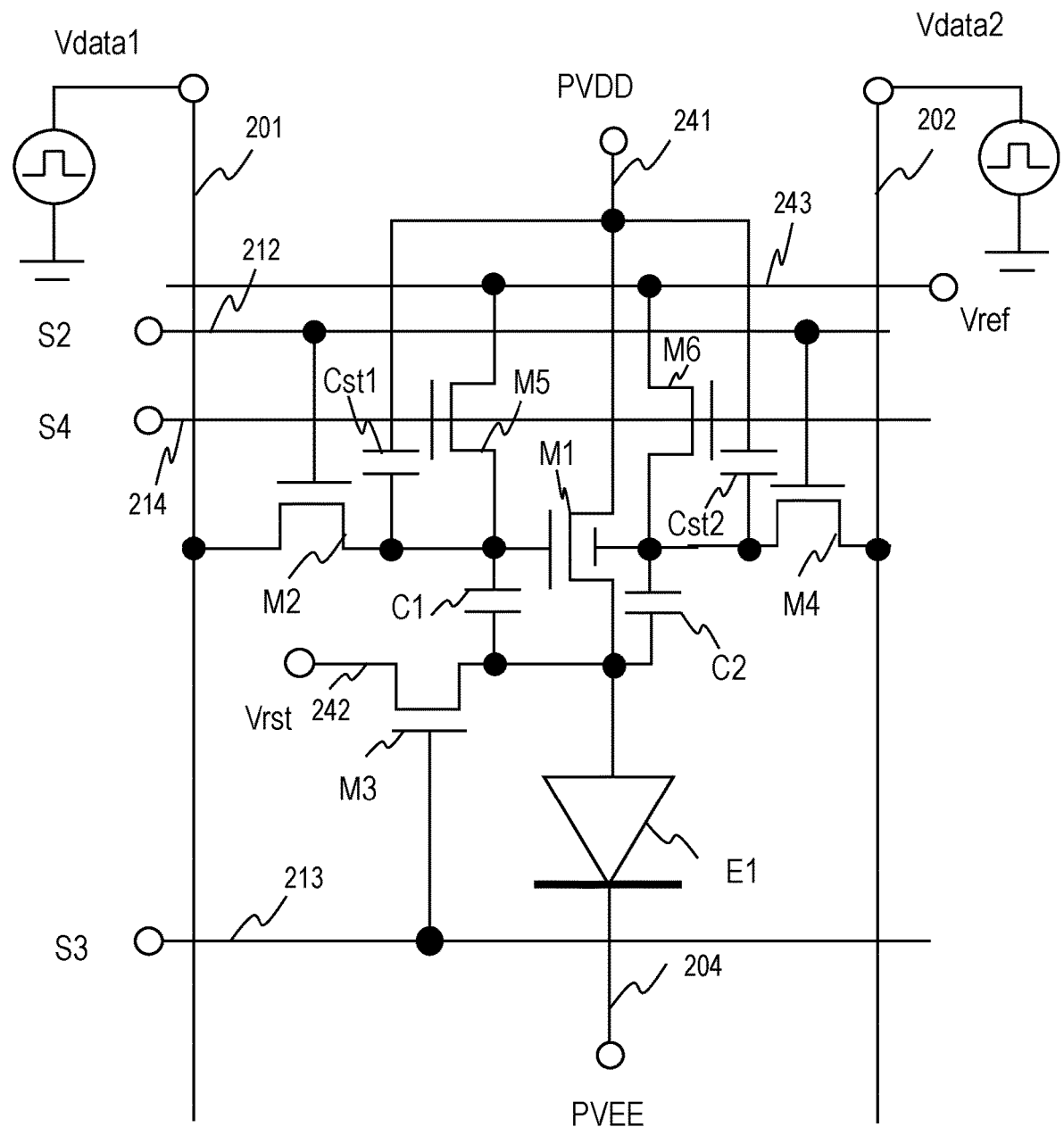
FIG. 9 illustrates a configuration example of a pixel circuit and control signals therefor in another embodiment of this specification.

FIG. 9 illustrates a configuration example of a pixel circuit and control signals therefor in another embodiment of this specification. This pixel circuit compensates for the variation in threshold voltage Vth of the driving transistor M1. Differences from the pixel circuit configuration illustrated in FIG. 2 are mainly described. This pixel circuit includes transistors M5 and M6 in addition to the pixel circuit in FIG. 2. These are n-type TFTs. Furthermore, a transmission line 214 for transmitting a selection signal S4 and a power line 243 for transmitting a reference power supply potential Vref are added. The value of the reference power supply potential Vref can be a value between the positive power supply potential PVDD and the reset power supply potential Vrst, for example, a value higher than the reset power supply potential Vrst by several volts.

The transistor M5 is connected between the first gate electrode G1 (the reference sign is omitted in FIG. 9) of the driving transistor M1 and the power line 243 for the reference power supply potential. Its gate electrode is connected to the transmission line 214 for the selection signal S4. The transistor M6 is connected between the second gate electrode G2 (the reference sign is omitted in FIG. 9) of the driving transistor M1 and the power line 243 for the reference power supply potential. Its gate electrode is connected to the transmission line 214 for the selection signal S4.

Figure 10:
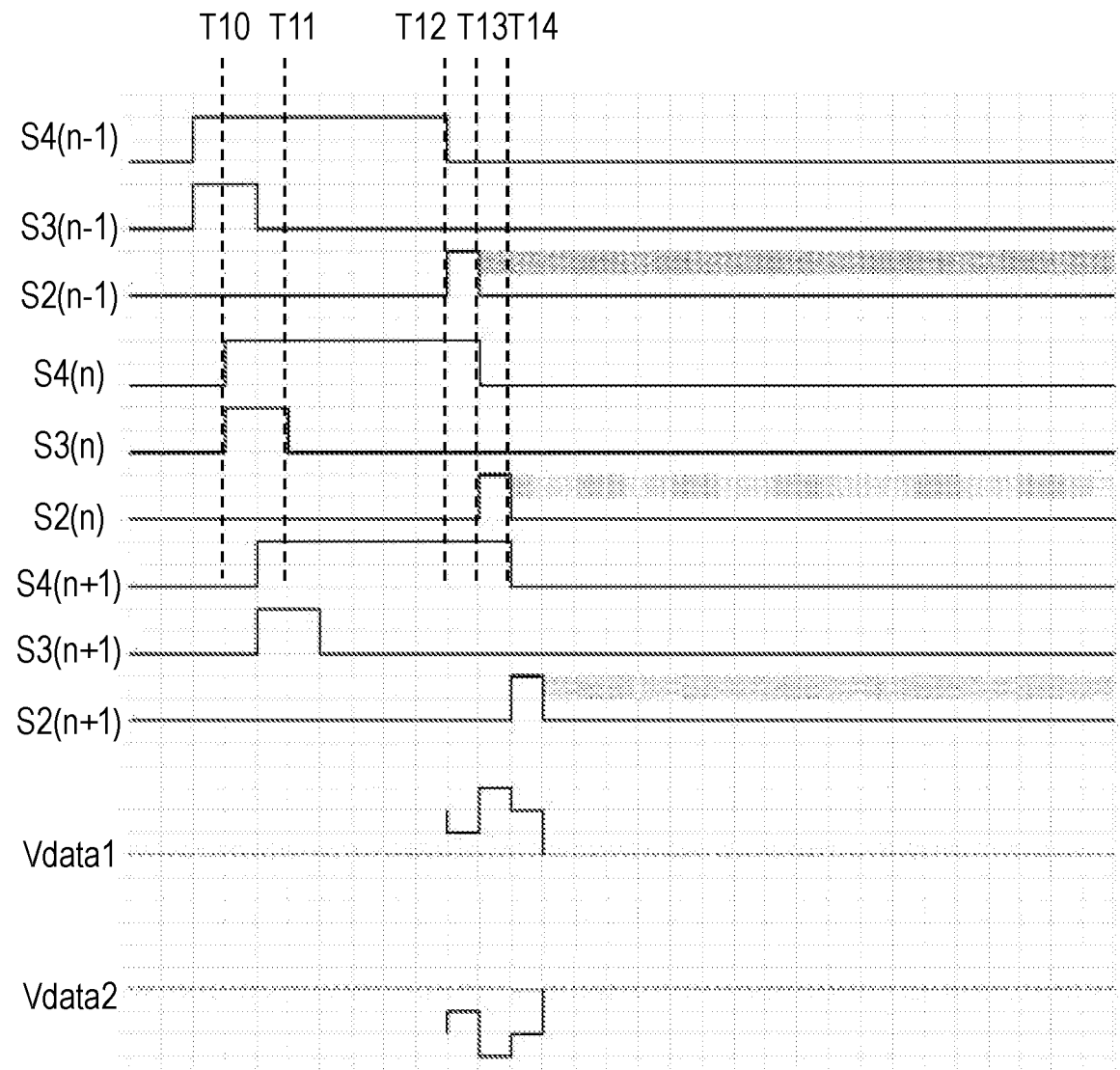
FIG. 10 is a timing chart for driving the pixel circuit illustrated in FIG. 9.

FIG. 10 is a timing chart for driving the pixel circuit illustrated in FIG. 9. Specifically, FIG. 10 illustrates temporal variation of control signals S2, S3, and S4 and data signals Vdata1 and Vdata2 for the (n−1)th, n-th, and (n+1)th pixel circuit rows. The same kind of control signals for two adjacent pixel circuit rows are shifted in phase by 1H.

Controlling a pixel circuit in the n-th pixel circuit row is described by way of example. At a time T10, the selection signal S4(n) changes from Low to High. In response, the transistors M5 and M6 turn ON. Further, the selection signal S3(n) changes from Low to High. In response, the transistor M3 turns ON. The selection signal S2(n) remains Low and the transistors M2 and M4 remain OFF.

At a time T11 later than the time T10 by 2H, the selection signal S3(n) changes from High to Low. The selection signal S4(n) remains High and the selection signal S2(n) remains Low. In response to the change of the selection signal S3(n), the transistor M3 turns OFF.

At a time T12 later than the time T11 by 5H, the selection signal S4(n) remains High. The selection signals S3(n) and S2(n) remain Low. During the period from the time T11 to T12, the storage capacitive elements Cst1 and Cst2 are charged with voltages for compensating for the variation in threshold voltage Vth at the first gate side and the second gate side of the driving transistor M1.

At a time T13 later than the time T12 by 1H, the selection signal S4(n) changes from High to Low. In response to the change of the selection signal S4(n), the transistors M5 and M6 turn OFF. The selection signal S2(n) changes from Low to High. The selection signal S3(n) remain Low. In response to the change of the selection signal S2(n), the transistors M2 and M4 turn ON. The data signals Vdata1 and Vdata2 are written to the pixel circuit.

At a time T14 later than the time T13 by 1H, the selection signal S2(n) changes from High to Low. The selection signals S4(n) and S3(n) remain Low. In response to the change of the selection signal S2(n), the transistors M2 and M4 turn OFF. The emission period of the n-th pixel circuit row starts at the time T14.

Figure 11:
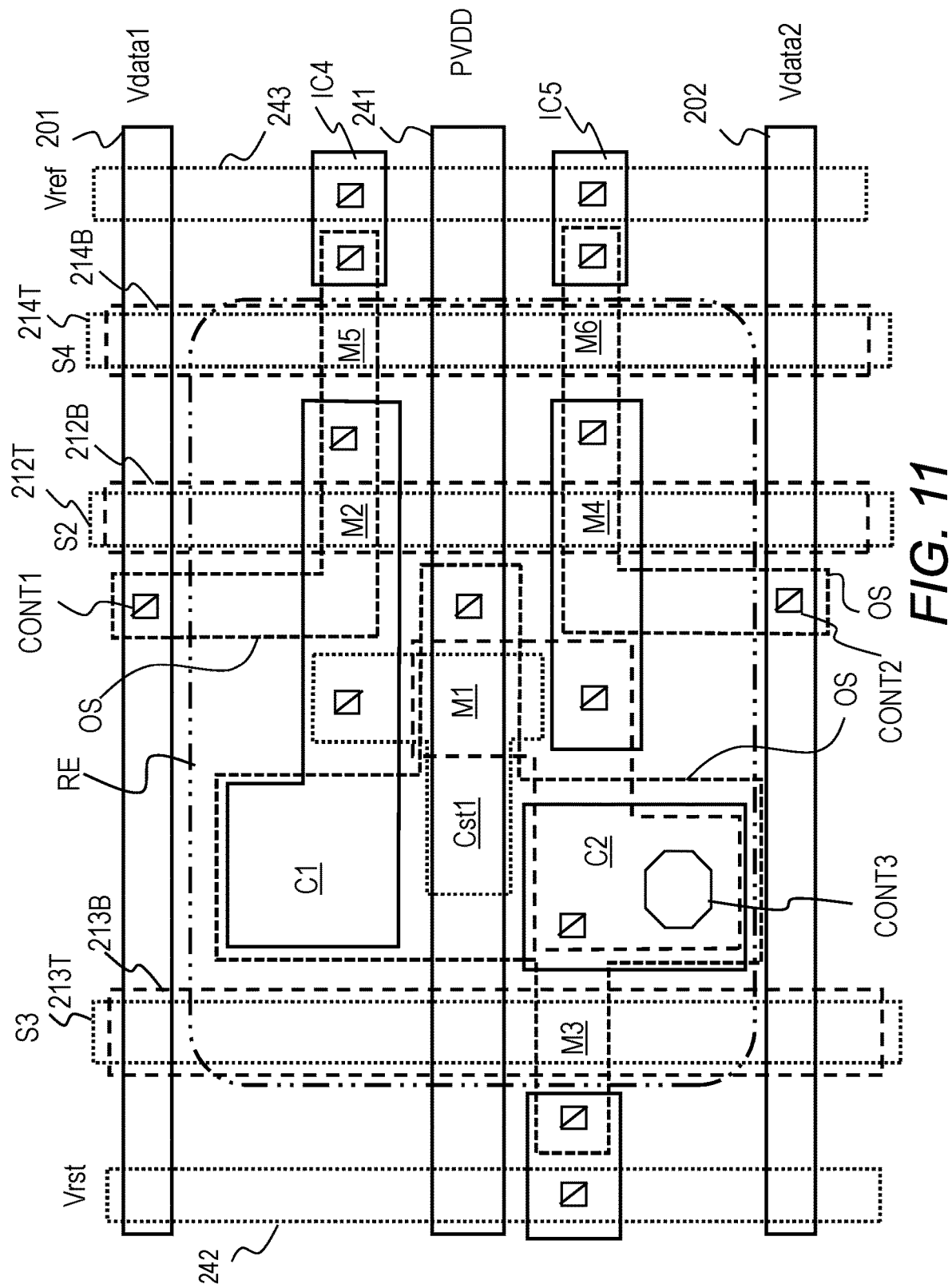
FIG. 11 is a plan diagram schematically illustrating the planar structure of a device of the pixel circuit illustrated in FIG. 9 when the device is viewed in the layering direction.

FIG. 11 is a plan diagram schematically illustrating the planar structure of a device of the pixel circuit in FIG. 9 when the device is viewed in the layering direction. The storage capacitive element Cst2 is omitted from FIG. 11. The elements same as those in the example of a pixel circuit in FIG. 6 are denoted by the same reference signs even if they have different shapes. FIG. 11 includes transistors M5 and M6, transmission lines 214T and 214B for the selection signal S4, and a power line 243 for the reference power supply potential Vref in addition to the elements of the pixel circuit in FIG. 6. The transistors M5 and M6 are oxide semiconductor TFTs.

The transistors M5 and M6 have a dual-gate structure; the top-gate electrode and the bottom-gate electrode of each transistor are supplied with the same control signal. The transmission lines 214T and 214B are to transmit the selection signal S4. A part of the transmission line 214T corresponds to the top-gate electrode of the transistor M5 and another part corresponds to the top-gate electrode of the transistor M6. A part of the transmission line 214B corresponds to the bottom-gate electrode of the transistor M5 and another part corresponds to the bottom-gate electrode of the transistor M6. The transmission line 214B is included in the first metal layer and the transmission line 214T is included in the second metal layer.

The power line 243 for the reference power supply potential Vref is included in the second metal layer. The interconnection region 104 connects the power line 243 and one of the source/drain regions of the transistor M5 with a contact region. The interconnection region 105 connects the power line 243 and one of the source/drain regions of the transistor M6 with a contact region.

Figure 12:
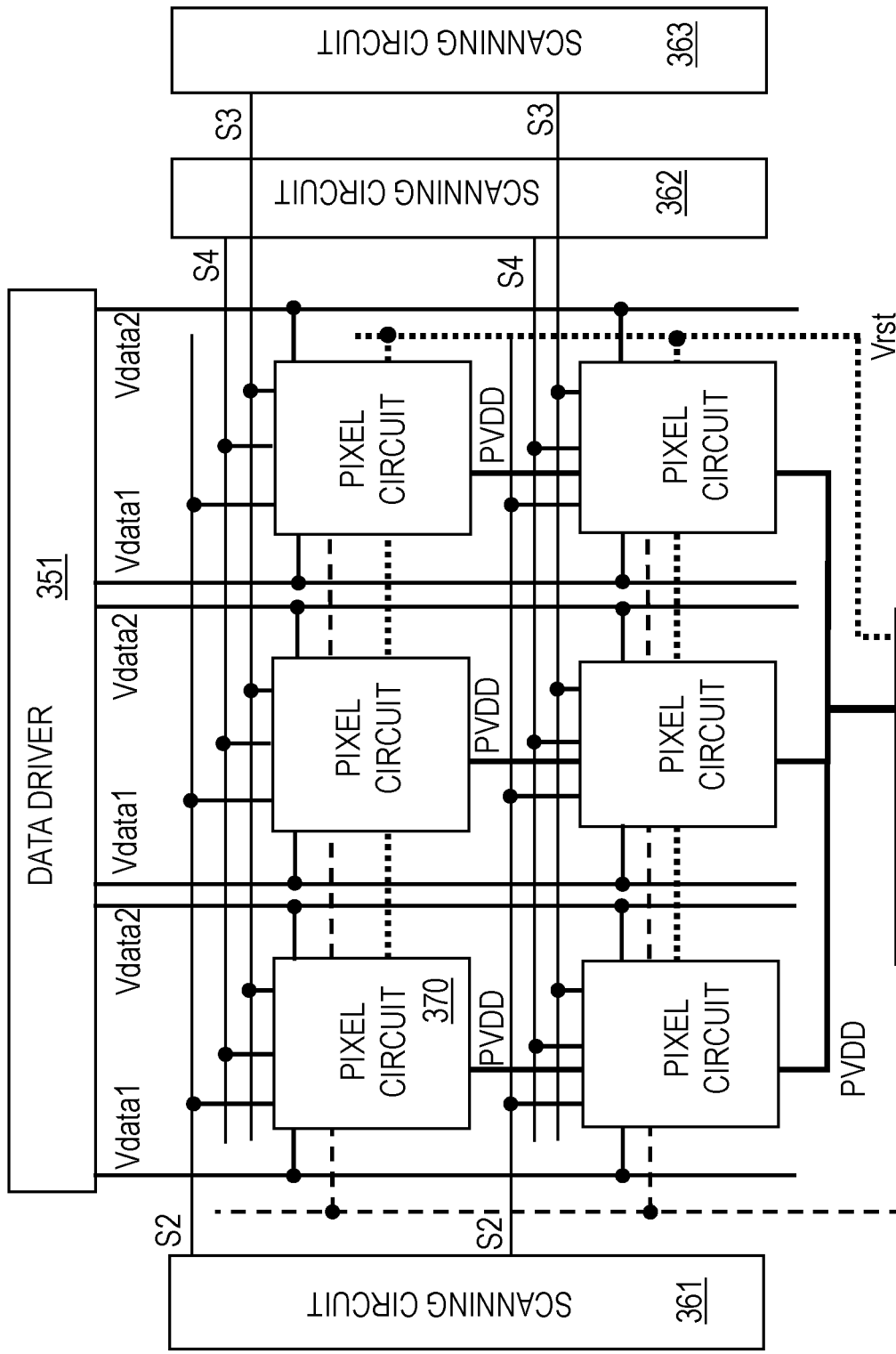
FIG. 12 schematically illustrates an example of the circuit configuration of a display device.

FIG. 12 schematically illustrates an example of the circuit configuration of a display device. The pixel circuits therein have the configuration illustrated in FIG. 9. The display region of the display device includes pixel circuits 370 arrayed in a matrix. In FIG. 12, one of the pixel circuits is provided with a reference sign 370 by way of example. The number of pixel circuits and the size of each pixel circuit are different from the actual ones.

The control circuit includes a data driver 371, a power supply circuit 372, and scanning circuits 361, 362, and 363 disposed outside the display region. The data driver 351 outputs first data signals Vdata1 and second data signals Vdata2 to individual pixel circuits columns. The power supply circuit 352 supplies a positive power supply potential PVDD, a reference power supply potential Vref, and a reset power supply potential Vrst to the pixel circuits 370. The data driver 351 and the power supply circuit 352 can be included in the driver IC 134.

The scanning circuit 361 outputs selection signals S2 for individual pixel circuit rows one after another. The scanning circuit 362 outputs selection signals S4 for individual pixel circuit rows one after another. The scanning circuit 363 outputs selection signals S3 for individual pixel circuit rows one after another.

Figure 13:
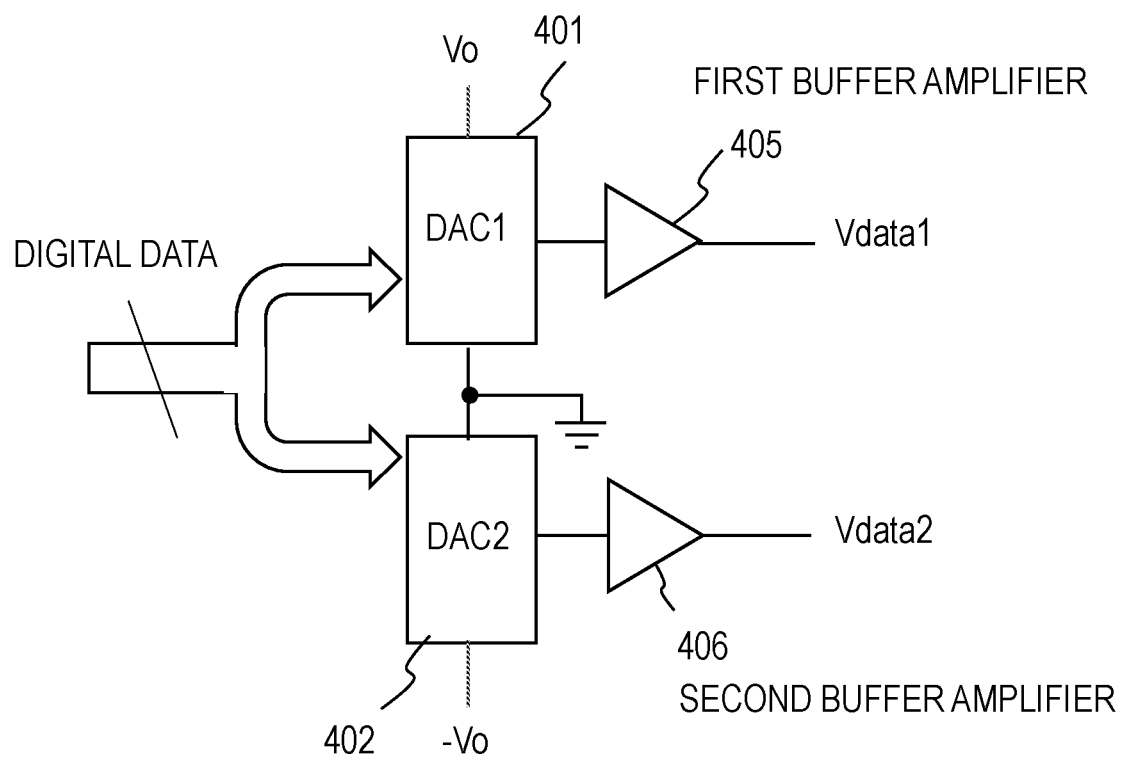
FIG. 13 illustrates a configuration example of a circuit in a data driver for outputting a first data signal Vdata1 and a second data signal Vdata2 to one pixel circuit column.

FIG. 13 illustrates a configuration example of a circuit for outputting a first data signal Vdata1 and a second data signal Vdata2 to one pixel circuit column. This circuit is included in the data driver 351. The data driver 351 includes a first DA converter (DAC1) 401, a second DA converter (DAC2) 402, a first buffer amplifier 405, and a second buffer amplifier 406. The first DA converter 401 is supplied with a reference potential (Vo) and the ground potential to perform DA conversion. The second DA converter 402 is supplied with a reference potential (−Vo) and the ground potential to perform DA conversion.

The first DA converter 401 converts digital data to an analog signal. The first buffer amplifier 405 amplifies the analog signal from the first DA converter 401 (including into the same intensity) and outputs a first data signal Vdata1 to the data line. The second DA converter 402 converts the aforementioned digital data into another analog signal. The second buffer amplifier 406 amplifies the analog signal from the second DA converter 402 (including into the same intensity) and outputs a second data signal Vdata2 to the data line. A desirable characteristic for the relation between the first data signal Vdata1 and the second data signal Vdata2 can be selected by appropriately selecting the reference potential to be supplied to the second DA converter 402.

Figure 14:
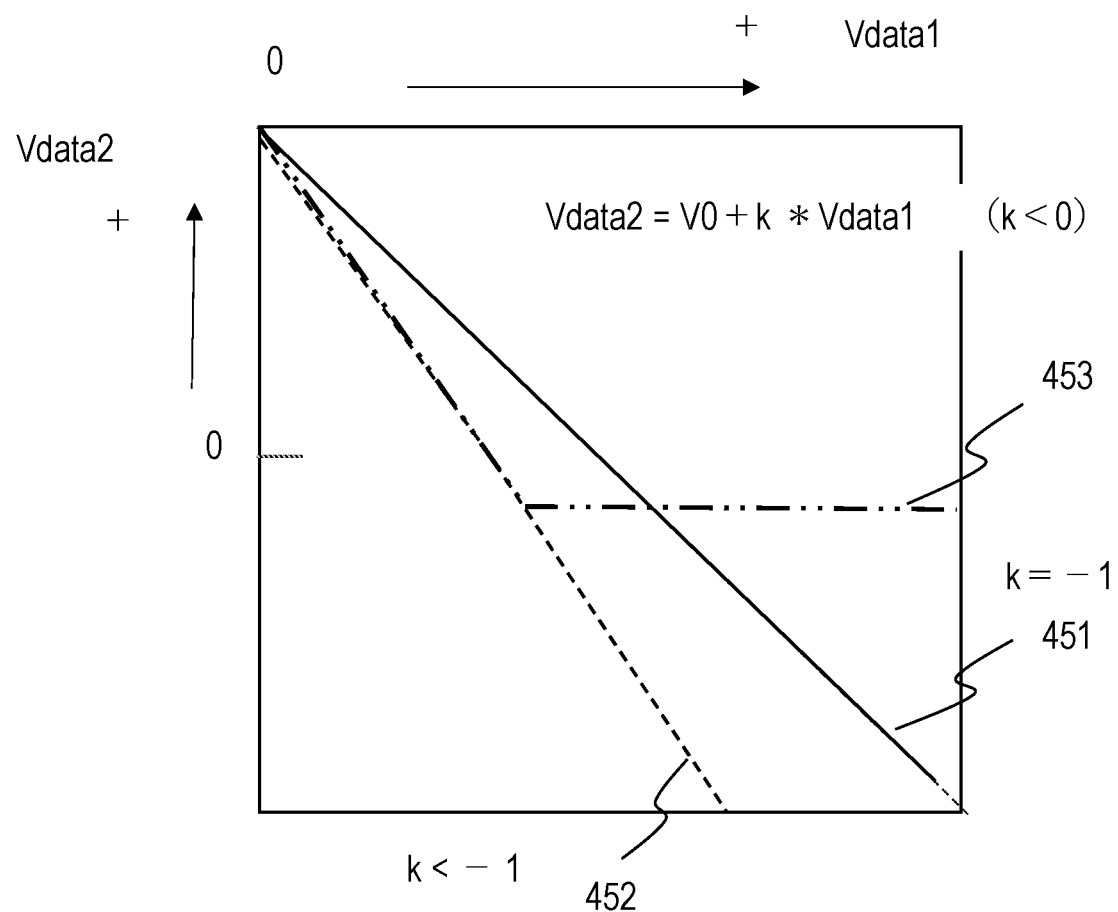
FIG. 14 illustrates examples of the relation between the first data signal Vdata1 and the second data signal Vdata2.

FIG. 14 illustrates examples of the relation between the first data signal Vdata1 and the second data signal Vdata2. The horizontal axis of the graph represents the first data signal Vdata1 and the vertical axis represents the second data signal Vdata2. The solid line 451 represents the relation of Vdata2=V0−Vdata1. The dashed line 452 represents the relation of Vdata2=V0+k*Vdata1 (k<−1). In the relation represented by the dashed two-dotted line 453, Vdata2 linearly decreases with increase of Vdata1 in the low-level region and becomes constant from a specific gray scale level.

In an embodiment of this specification, Vdata2 varies opposite in polarity to Vdata1 in at least a part of the gray scale (brightness) range of OLED elements for displaying images that includes some consecutive lowest levels. In other words, the variation rate of Vdata2 with respect to Vdata1 is lower than 0 in the partial range including the lowest gray scale level of OLED elements. This configuration increases the potential difference (voltage difference) between gray scale levels and facilitates the emission control, especially in the low grayscale range. Hence, the unevenness in display can be effectively reduced.

The relation between Vdata2 and Vdata1 is not limited to the examples provided in FIG. 14. For example, Vdata2 can decrease nonlinearly with increase of Vdata1 in at least a part of the gray scale range. The variation rate of Vdata2 with respect to Vdata1 can be not higher than 0 in the entire range from the lowest level to the highest level or positive in a part of the gray scale range.

Figure 15:
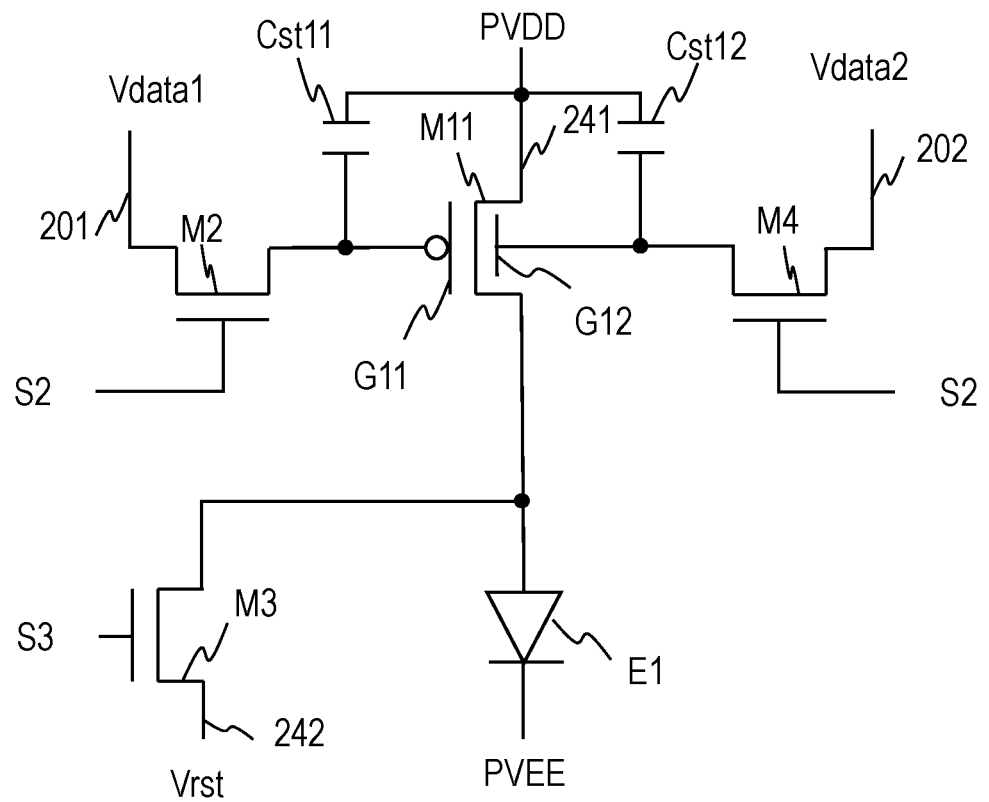
FIG. 15 illustrates a configuration example of a pixel circuit and control signals therefor in still another embodiment of this specification.

FIG. 15 illustrates a configuration example of a pixel circuit and control signals therefor in still another embodiment of this specification. This pixel circuit is included in the l-th pixel circuit row (l is an integer). The following mainly describes differences from the pixel circuit in FIG. 2.

The pixel circuit in FIG. 15 is obtained by replacing the driving transistor M1 in FIG. 2 with a driving transistor M11 of a p-type TFT and the storage capacitive elements Cst1 and Cst2 in FIG. 2 with storage capacitive elements Cst11 and Cst12. The capacitive elements C1 and C2 in FIG. 2 are excluded.

The transistor M11 is a driving transistor for controlling the amount of lighting current for the OLED element E1. The transistor M11 has a dual-gate structure. The source region of the driving transistor M11 is connected to a power line 241 for transmitting a positive power supply potential PVDD. The driving transistor M11 controls the amount of lighting current to be supplied from the power line 241 to the OLED element E1 in accordance with the gate voltages at the two gate electrodes G11 and G12.

The pixel circuit includes storage capacitive elements Cst11 and Cst12. The storage capacitive element Cst11 is connected between the power line 241 for transmitting the positive power supply potential PVDD and the first gate electrode G11 of the driving transistor M11. The storage capacitive element Cst11 stores the voltage between the first gate electrode G11 of the driving transistor M11 and the power line 241. The source region of the driving transistor M11 is connected to the power line 241 and the source potential is the positive power supply potential PVDD.

The storage capacitive element Cst11 holds the gate voltage of the first gate electrode G11 together with the gate capacitor of the first gate electrode G11. The gate voltage of the first gate electrode G11 is at a value depending on the first data signal Vdata1 transmitted by a first data line 201. The storage capacitive element Cst11 can be excluded depending on the design.

The storage capacitive element Cst12 is connected between the power line 241 for transmitting the positive power supply potential PVDD and the second gate electrode G12 of the driving transistor M11. The storage capacitive element Cst12 stores the voltage between the second gate electrode G12 of the driving transistor M11 and the power line 241.

The storage capacitive element Cst12 holds the gate voltage of the second gate electrode G12 together with the gate capacitor of the second gate electrode G12. The gate voltage of the second gate electrode G12 is at a value depending on the second data signal Vdata2 transmitted by a second data line 202. In an embodiment of this specification, the capacitance and the area of the storage capacitive element Cst12 are smaller than those of the storage capacitive element Cst11. This configuration facilitates implementation of the pixel circuit while achieving appropriate control of the driving transistor M11. The storage capacitive element Cst12 can be excluded depending on the design.

One of the source/drain regions (the source region or the drain region) of the transistor M2 is connected to a node between the first gate electrode G11 and the first storage capacitive element Cst11 and the other source/drain region is connected to the data line 201 for transmitting the first data signal Vdata1. When the transistor M2 is ON, the transistor M2 supplies the first data signal Vdata1 supplied from the driver IC 134 through the data line 201 to the first gate electrode G11 and the first storage capacitive element Cst11.

One of the source/drain regions of the transistor M4 is connected to a node between the second gate electrode G12 and the second storage capacitive element Cst12 and the other source/drain region is connected to the data line 202 for transmitting the second data signal Vdata2. When the transistor M4 is ON, the transistor M4 supplies the second data signal Vdata2 supplied from the driver IC 134 through the data line 202 to the second gate electrode G12 and the second storage capacitive element Cst12.

In the example of FIG. 15, the anode of the OLED element E1 is connected to the drain region of the driving transistor M11. One of the source/drain regions of the transistor M3 is connected to a power line 242 for transmitting a reset potential Vrst and the other source/drain region is connected to the drain region of the driving transistor M11 and the anode of the OLED element E1. When the transistor M3 is turned ON by a selection signal S3 from the scanning circuit 131, it supplies the reset potential Vrst transmitted by the power line 242 to the drain region of the driving transistor M11 and the anode of the OLED element E1.

The timing chart of the signals for controlling the pixel circuit in FIG. 15 can be the same one provided in FIG. 4.

Figure 16:
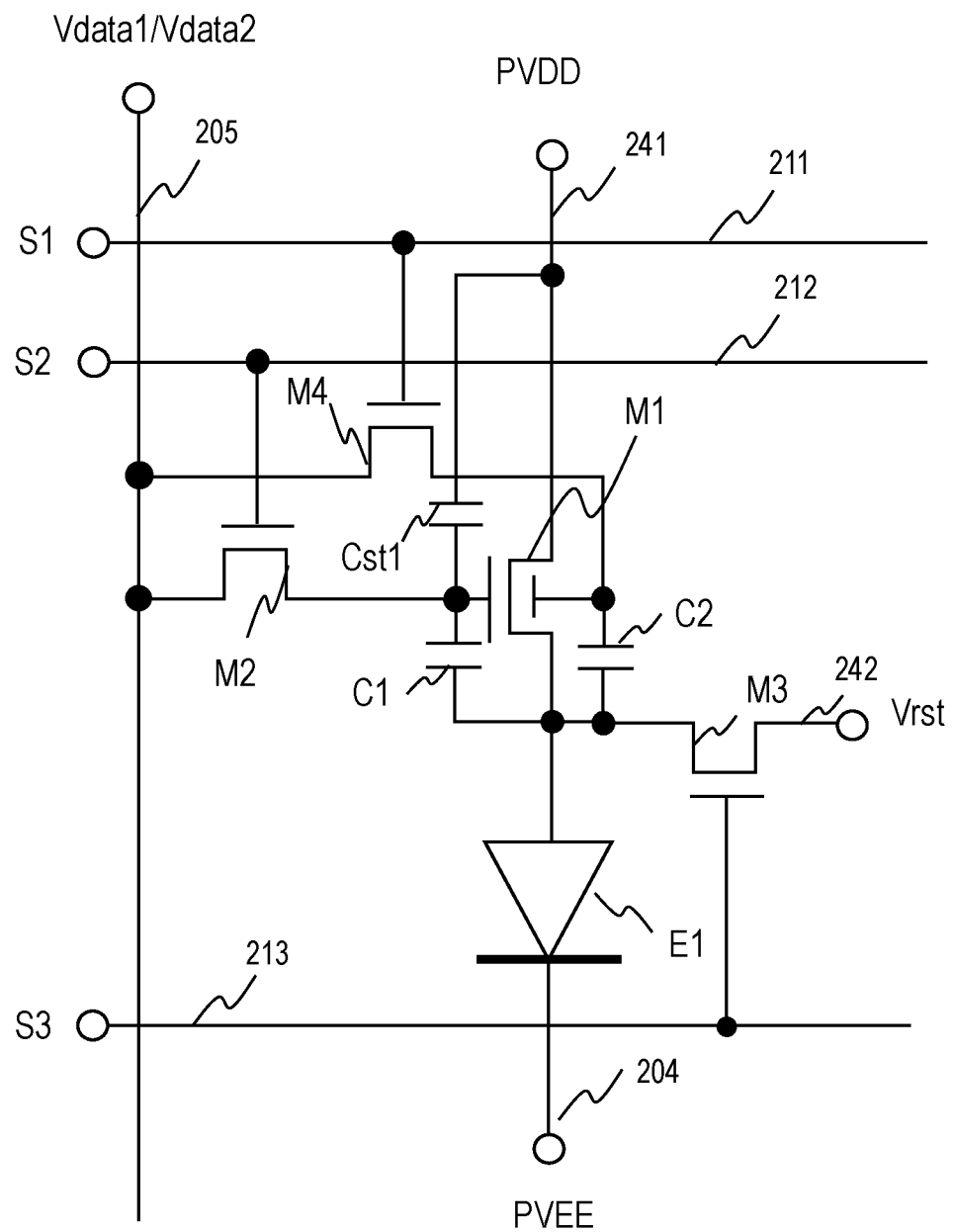
FIG. 16 illustrates still another configuration example of a pixel circuit.

Next, still another configuration example of a pixel circuit is described. FIG. 16 illustrates still another configuration example of a pixel circuit. The pixel circuit in FIG. 16 receives the first data signal Vdata1 and the second data signal Vdata2 through a common data line. This configuration attains a smaller number of data lines. The following mainly describes differences from the pixel circuit in FIG. 2.

The gate electrode of the transistor M4 is connected to the transmission line 211 for transmitting the selection signal S1 and the transistor M4 is turned ON/OFF by the selection signal S1. The selection signal S1 may be supplied from the scanning circuit that is not illustrated. The transmission line 211 is different from the transmission line 212 for the selection signal S2 and the transmission line 213 for the selection signal S3. A common data line 205 transmits the first data signal Vdata1 and the second data signal Vdata2 by time division. One of the source/drain regions of the transistor M2 and one of the source/drain regions of the transistor M4 are connected to the common data line 205. The storage capacitive element Cst2 shown in FIG. 2 is excluded.

Figure 17:
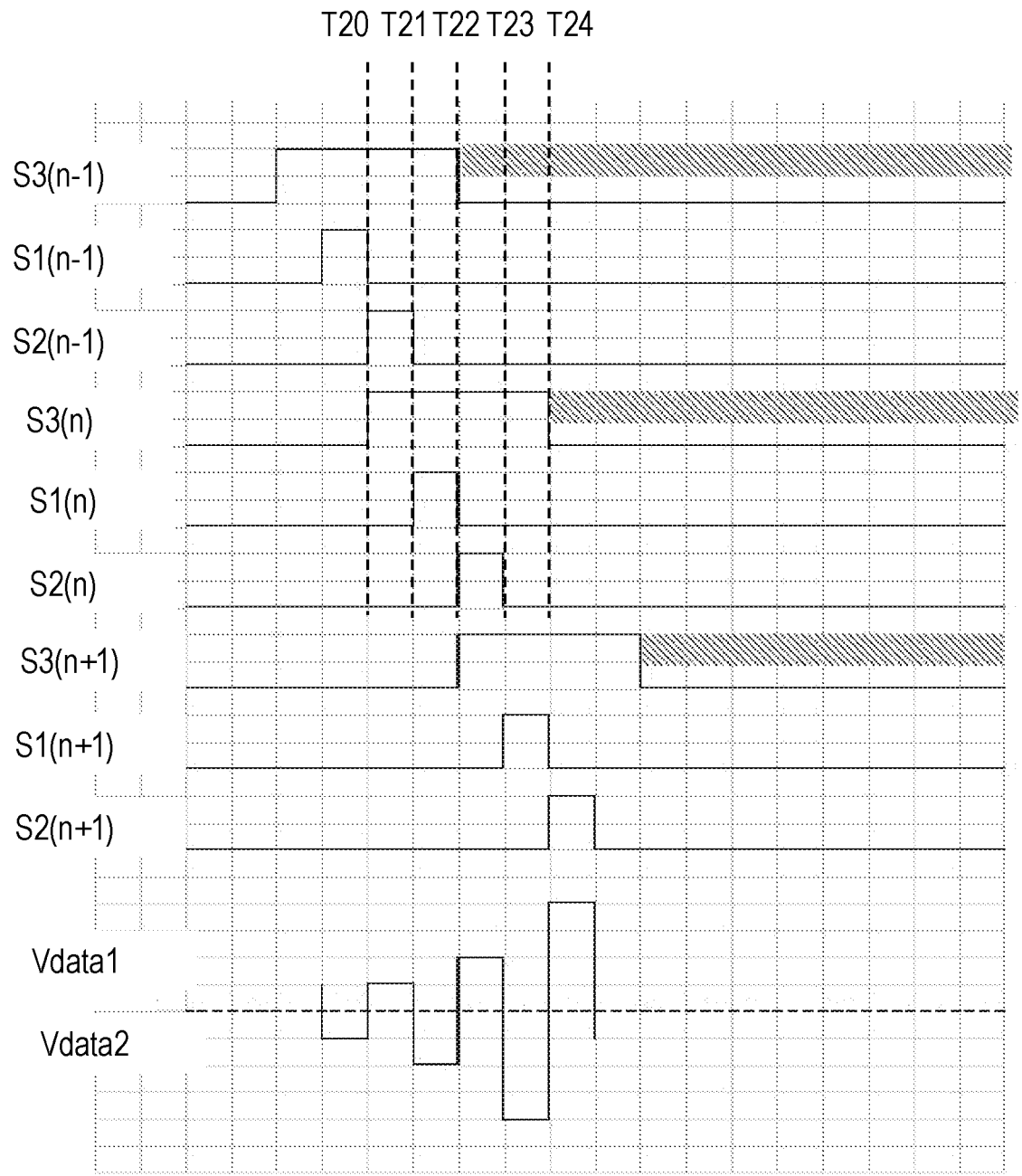
FIG. 17 is a timing chart for driving the pixel circuit illustrated in FIG. 16.

FIG. 17 is a timing chart for driving the pixel circuit illustrated in FIG. 16. Specifically, FIG. 17 illustrates temporal variation of control signals S1, S2, and S3 and data signals Vdata1 and Vdata2 for the (n−1)th, n-th, and (n+1)th pixel circuit rows. The same kind of control signals for two adjacent pixel circuit rows are shifted in phase by 2H.

Controlling a pixel circuit in the n-th row is described by way of example. At a time T20, the selection signal S3(n) changes from Low to High. In response, the transistor M3 turns ON. The selection signals S1(n) and S2(n) remain Low; the transistors M2 and M4 remain OFF.

At a time T21 later than the time T20 by 1H, the selection signal S1(n) changes from Low to High. The selection signal S3(n) remains High and the selection signal S2(n) remains Low. In response to the change of the selection signal S1(n), the transistor M4 turns ON. The second data signal Vdata2 is written to the pixel circuit via the transistor M4.

At a time T22 later than the time T21 by 1H, the selection signal S1(n) changes from High to Low and the selection signal S2(n) changes from Low to High. The selection signal S3(n) remains High. In response to the change of the selection signal S1(n), the transistor M4 turns OFF. In response to the change of the selection signal S2(n), the transistor M2 turns ON. The first data signal Vdata1 is written to the pixel circuit via the transistor M2.

At a time T23 later than the time T22 by 1H, the selection signal S2(n) changes from High to Low. The selection signal S1(n) remains Low and the selection signal S3(n) remains High. In response to the change of the selection signal S2(n), the transistor M2 turns OFF.

At a time T24 later than the time T23 by 1H, the selection signal S3(n) changes from High to Low. The selection signals S1(n) and S2(n) remain Low. In response to the change of the selection signal S3(n), the transistor M3 turns OFF. The emission period of the n-th pixel circuit row starts at the time T24.

Figure 18:
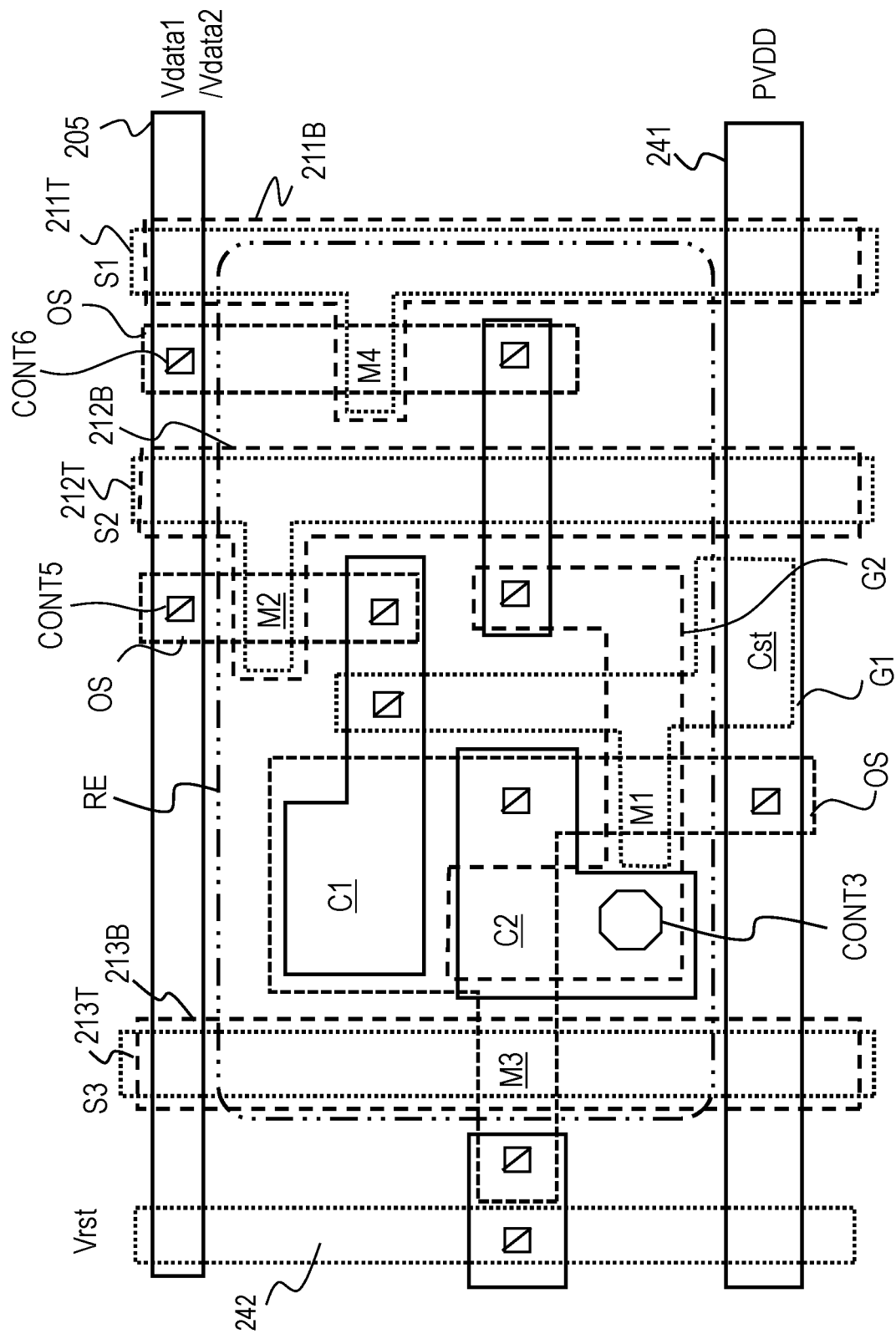
FIG. 18 is a plan diagram schematically illustrating the planar structure of a device of the pixel circuit illustrated in FIG. 16 when the device is viewed in the layering direction.

FIG. 18 is a plan diagram schematically illustrating the planar structure of a device of the pixel circuit illustrated in FIG. 16 when the device is viewed in the layering direction. The elements same as those in the example of a pixel circuit in FIG. 6 are denoted by the same reference signs even if they have different shapes. FIG. 18 includes a common data line 205 in place of the data lines 201 and 202 in FIG. 6 and further includes transmission lines 211B and 211T for the selection signal S1.

One of the source/drain regions of the transistor M2 is connected to the common data line 205 through a contact region CONT5. One of the source/drain regions of the transistor M4 is connected to the common data line 205 through a contact region CONTE.

The transmission lines 211T and 211B transmit the selection signal S1. A part of the transmission line 211T corresponds to the top-gate electrode of the transistor M4 and a part of the transmission line 211B corresponds to the bottom-gate electrode of the transistor M4. The transmission line 211B is included in the first metal layer and the transmission line 211T is included in the second metal layer.

Figure 19:
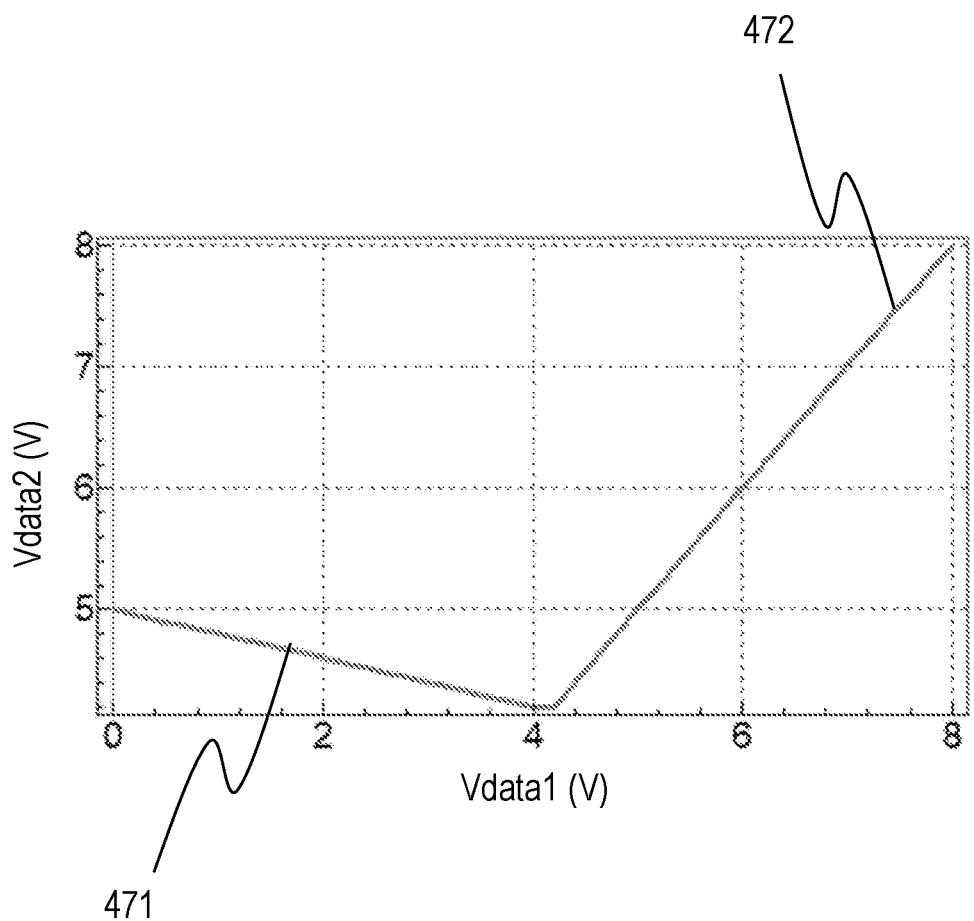
FIG. 19 illustrates an example of the relation between the first data signal Vdata1 and the second data signal Vdata2.

FIG. 19 illustrates an example of the relation between the first data signal Vdata1 and the second data signal Vdata2. The horizontal axis of the graph represents the first data signal Vdata1 and the vertical axis represents the second data signal Vdata2. In the example of FIG. 19, the function representing the relation between the first data signal Vdata1 and the second data signal Vdata2 consists of two continuous linear functions. Specifically, they are the function represented by the line 471 in the low gray scale region and the function represented by the line 472 in the high gray scale region.

The relation of the line 471 is expressed as Vdata2=V0+ η0*Vdata1 (η0<0). The relation of the line 472 is expressed as Vdata2=V0+η1*Vdata1 (η1>0). In the relation represented by the line 471, Vdata2 linearly decreases with increase of Vdata1. In the relation represented by the line 472, Vdata2 linearly increases with increase of Vdata1.

In the example of FIG. 19, Vdata2 varies opposite in polarity to Vdata1 in the low gray scale range for an OLED element to display images or the range where Vdata1 is from 0 V to 4 V. This configuration provides large potential (voltage) differences between adjacent gray scale levels in the low gray scale range, which facilitates the emission control in the low gray scale range and reduces the unevenness in display effectively. In the high gray scale range, Vdata2 varies in the same polarity as Vdata1. This configuration prevents the highest brightness from lowering. As understood from this description, the example of the relation in FIG. 19 expands the data range to moderate the variation in brightness only in the low gray scale region while preventing the highest brightness from lowering.

Figure 20:
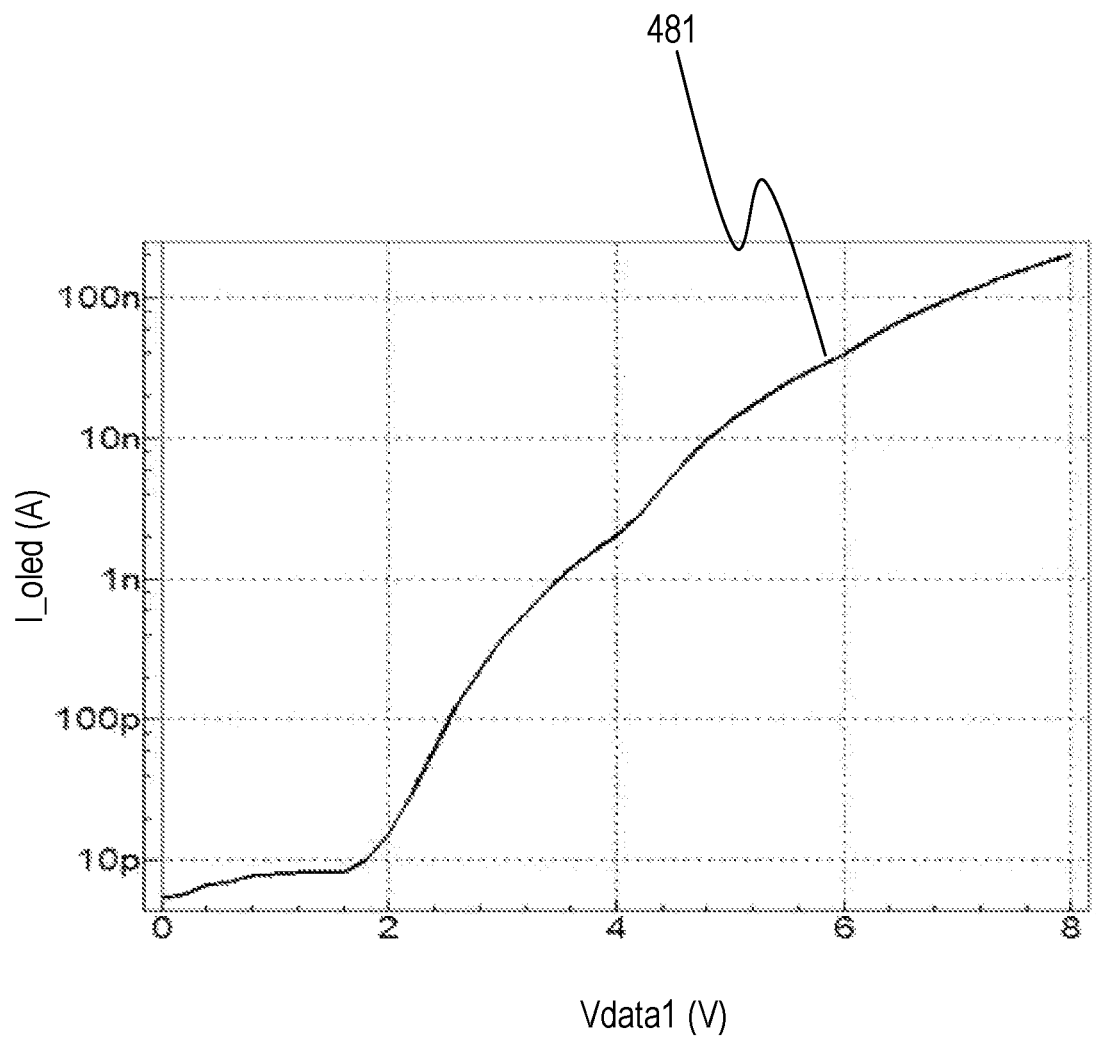
FIG. 20 is a graph illustrating the effect of the relation between the first data signal and the second data signal in FIG. 19.

FIG. 20 is a graph illustrating the effect of the relation between the first data signal and the second data signal in FIG. 19. The horizontal axis represents the first data signal Vdata1 and the vertical axis represents the current I_oled supplied to an OLED element. When the current I_oled is large, the brightness of the OLED element is high. The curve 481 represents the relation between the first data signal Vdata1 and the current I_oled under the relation between the first data signal Vdata1 and the second data signal Vdata2 in FIG. 19. The first and second data signals in FIG. 19 can expand the data range only in the low gray scale range.

Hereinafter, data signals in a high dynamic range (HDR) mode are described. The HDR mode selectively increases the brightness of bright pixels without changing the brightness of dark pixels to expand the dynamic range of the displayed image. In displaying an image having a large brightness difference in a standard mode, adjusting a bright area of the image to be seen comfortably makes a dark area become crushed shadows and adjusting a dark area to be seen comfortably makes a bright area become blown highlights. The HDR mode attains comfortable display while sacrificing neither the dark area nor the bright area. The control circuit including the driver IC 134 selects one mode from a plurality of modes for each pixel in accordance with an instruction from an external system. The mode selection can be performed for the entire display region. Three or more modes can be defined and the relation between the first data signal and the second data signal can be different among the modes.

As described above, the driving method in an embodiment of this specification determines the combination of the first data signal Vdata1 and the second data signal Vdata2 individually for each pixel to provide a voltage-luminance characteristic specific to the pixel. This means that this driving method is applicable to HDR driving (HDR mode). An example of the HDR driving is described in the following.

Figure 21:
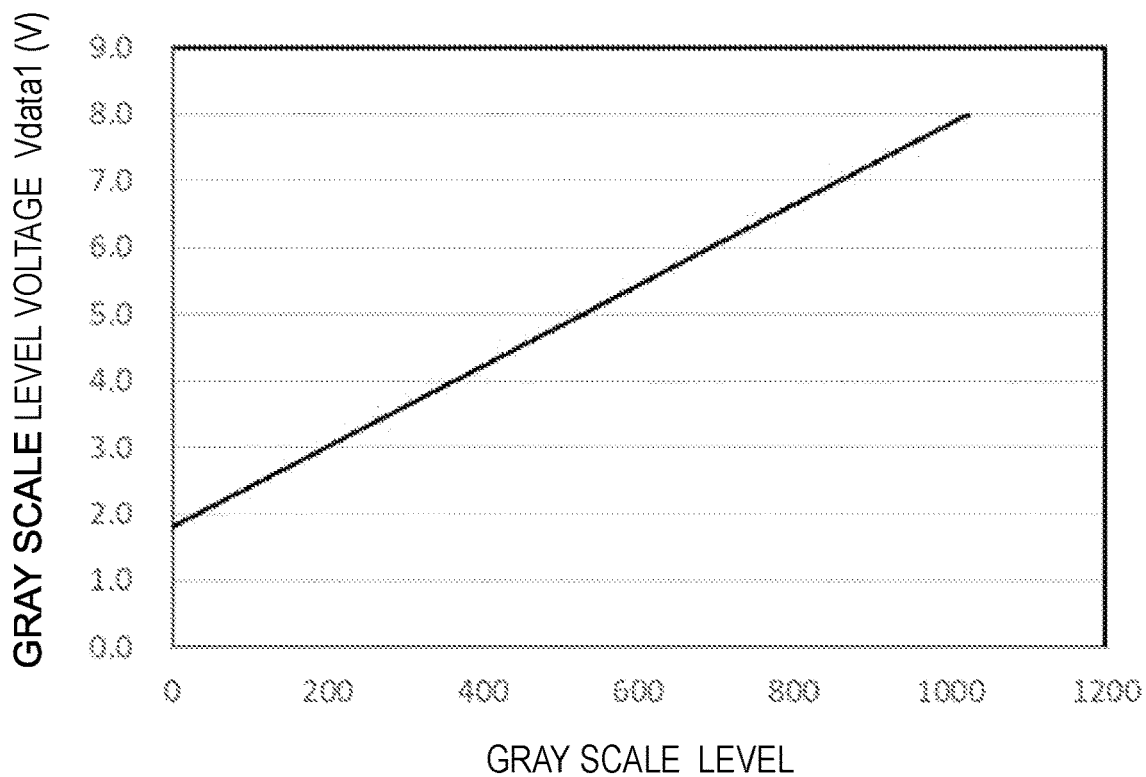
FIG. 21 illustrates an example of the relation between the gray scale level and the first data signal Vdata1.

FIG. 21 illustrates an example of the relation between the gray scale level and the first data signal Vdata1. In the example of FIG. 21, the first data signal Vdata1 linearly increases with increase of the gray scale level. This relation can be common to the standard mode and the HDR mode. In other words, the relation between video data (the gray scale level determined therefrom) and the first data signal can be common to all modes.

Figure 22:
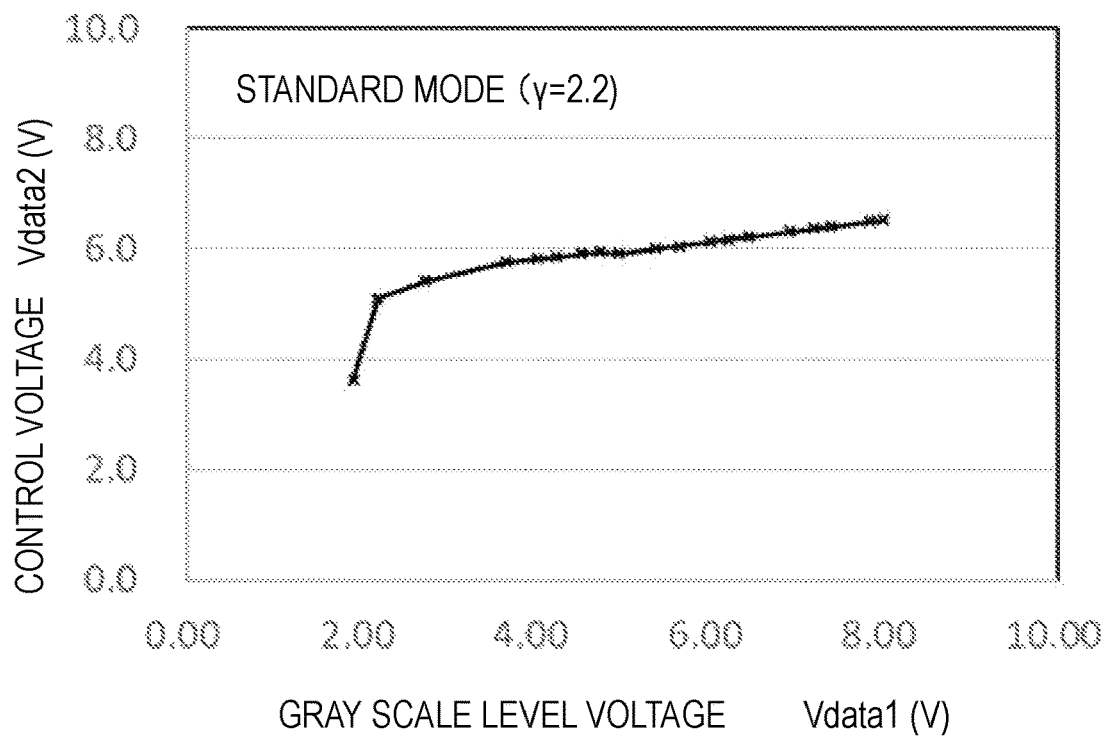
FIG. 22 illustrates an example of the relation between a control voltage Vdata2 and an gray scale level voltage Vdata1 in displaying without using HDR driving.

FIG. 22 illustrates an example of the relation between a control voltage Vdata2 and an gray scale level voltage Vdata1 in displaying without using HDR driving but using a standard gamma value of 2.2. The first data signal Vdata1 is referred to as gray scale level voltage and the second data signal Vdata2 as control voltage. As described above, the first data signal Vdata1 is determined in accordance with the gray scale level of the pixel determined from video data. The control voltage (second data signal) Vdata2 is determined based on the gray scale level voltage Vdata1 in accordance with a predefined function.

In the example of FIG. 22, the increasing rate of the control voltage Vdata2 is substantially constant (linear variation) in a range higher than a specific gray scale level voltage. In the range lower than the specific gray scale level voltage, the control voltage Vdata2 increases linearly with increase of the gray scale level voltage Vdata1 and its variation rate is higher than the variation rate in the high-level range.

Figure 23:
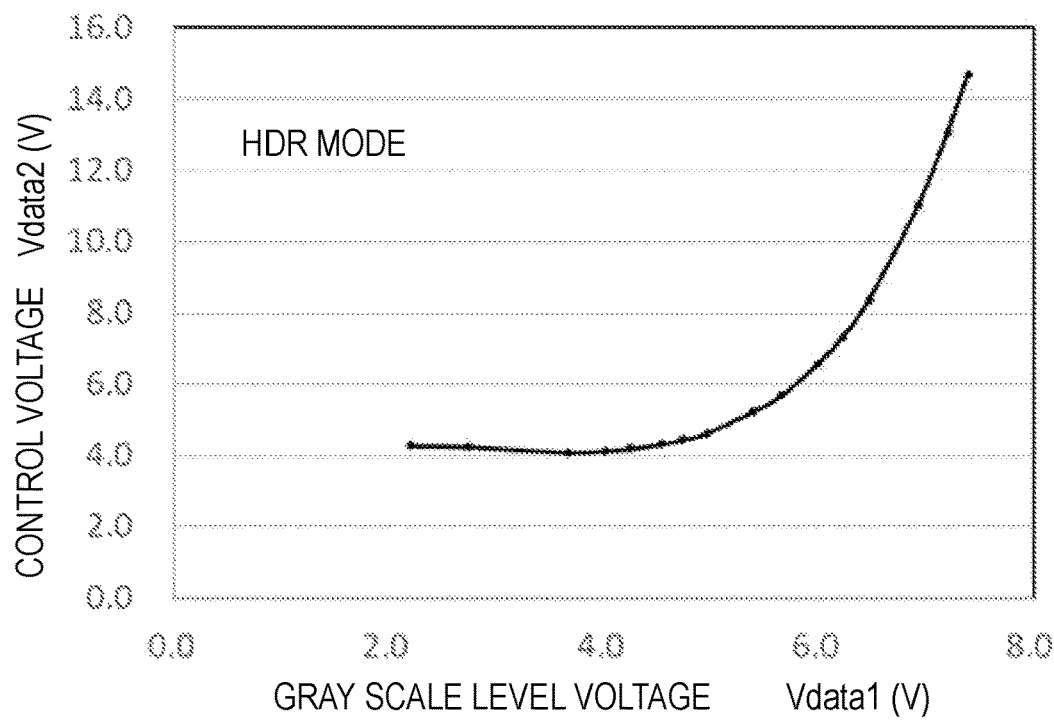
FIG. 23 illustrates an example of the relation between the control voltage Vdata2 and the gray scale level voltage Vdata1 in an HDR mode.

FIG. 23 illustrates an example of the relation between the control voltage Vdata2 and the gray scale level voltage Vdata1 in the HDR mode. In the range where the gray scale level voltage Vdata1 is from 2 V to 4 V, the control voltage Vdata2 decreases and varies opposite in polarity (direction) to the gray scale level voltage Vdata1. In the high-level range where the gray scale level voltage Vdata1 is higher than 4 V and the highest level is included, Vdata2 increases in a super linear fashion with increase of Vdata1. (Super linear is above a linear line, and super linear means a function that eventually grows faster than any linear one.) Compared to the standard mode illustrated in FIG. 22, the difference between the highest value and the lowest value of the control voltage Vdata2 is large.

Figure 24:
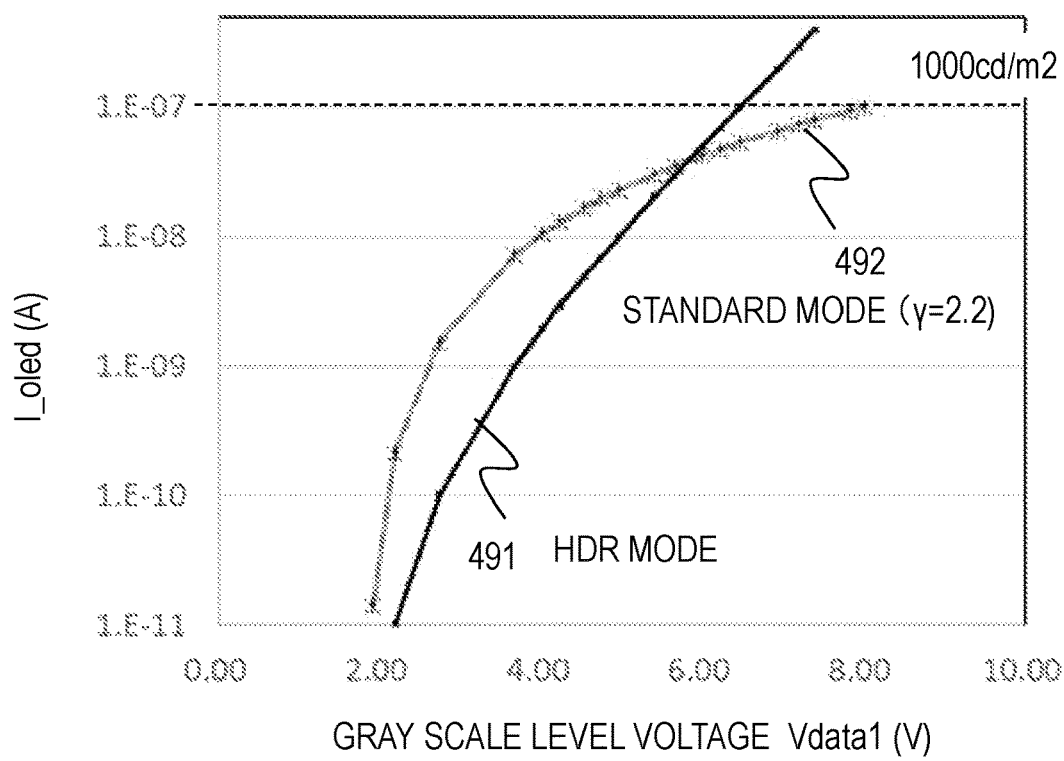
FIG. 24 illustrates an example of the relation between the gray scale level voltage Vdata1 and the lighting current I_oled (brightness) in the HDR mode and an example of the relation between the gray scale level voltage Vdata1 and the lighting current I_oled (brightness) in the standard mode.

FIG. 24 illustrates an example 491 of the relation between the signal voltage Vdata1 and the lighting current I_oled (brightness) in the HDR mode and an example 492 of the relation between the signal voltage Vdata1 and the lighting current I_oled (brightness) in the standard mode. In the HDR mode, the maximum brightness is higher and the variation rate of the lighting current with respect to the signal voltage Vdata1 varies gentler than in the standard mode. The gentle variation of the lighting current reduces the unevenness in display, which is noticeable in the low to middle brightness range, and attains high maximum brightness. As described above, the display modes are defined by different relations between the first data signal and the second data signal and by different relations between the first data signal and brightness level of the light-emitting element.

Coordinating the first data signal Vdata1 and the second data signal Vdata2 differently and switching the characteristics in FIGS. 22 and 23 depending on the pixel enable each pixel to have a different voltage-luminance characteristic (mode). For example, in an image generally dark but having a very bright area like a picture of a firework in a night view, the dynamic range of the displayed image can be expanded by raising the brightness of bright pixels without changing the brightness of dark pixels; a more vivid image can be displayed.

Hereinafter, a configuration example where a micro-LED chip (element) is employed as a light-emitting element in place of an OLED element is described. A micro-LED chip is an element including an inorganic compound semiconductor as light-emitting material. Compared to an OLED element, it is highly reliable and exhibits small reduction in luminous efficiency even if it is driven to light at high intensity for a long time. For this reason, it is advantageous for an electroluminescent display device having a wide dynamic range. The above-described control of a light-emitting element with a first data signal and a second data signal is applicable to a micro-LED display device employing a micro-LED chip as a light-emitting element.

Figure 25:
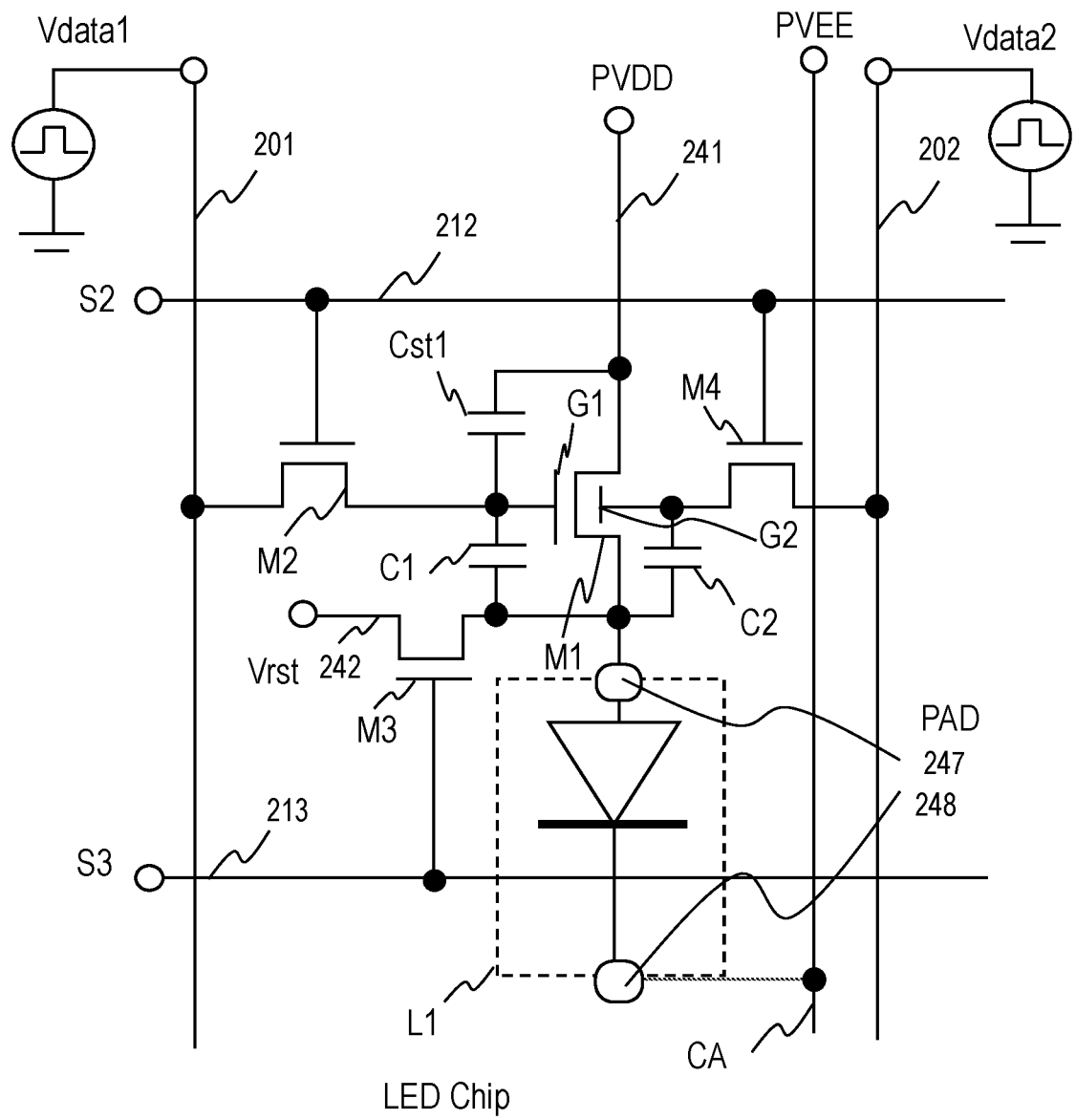
FIG. 25 illustrates a configuration example of a micro-LED pixel circuit.

FIG. 25 illustrates a configuration example of a micro-LED pixel circuit. Differences from the pixel circuit in FIG. 9 are mainly described. The micro-LED pixel circuit includes an LED chip L1 in place of the OLED element E1 in the pixel circuit in FIG. 9. The LED chip L1 is connected to the pixel circuit through pads 247 and 248. The pad 247 connects the anode of the LED chip L1 and the connection node of the capacitive elements C1 and C2 and the transistor M1.

The pad 248 connects the cathode of the LED chip L1 and a cathode line CA for transmitting the cathode power supply potential PVEE. Like in the foregoing other configuration examples, the data line for transmitting the first data signal and the data line for transmitting the second data signal can be the same one line or different lines. In the case of the common data line, it transmits the first data signal and the second data signal by time division.

Figure 26:
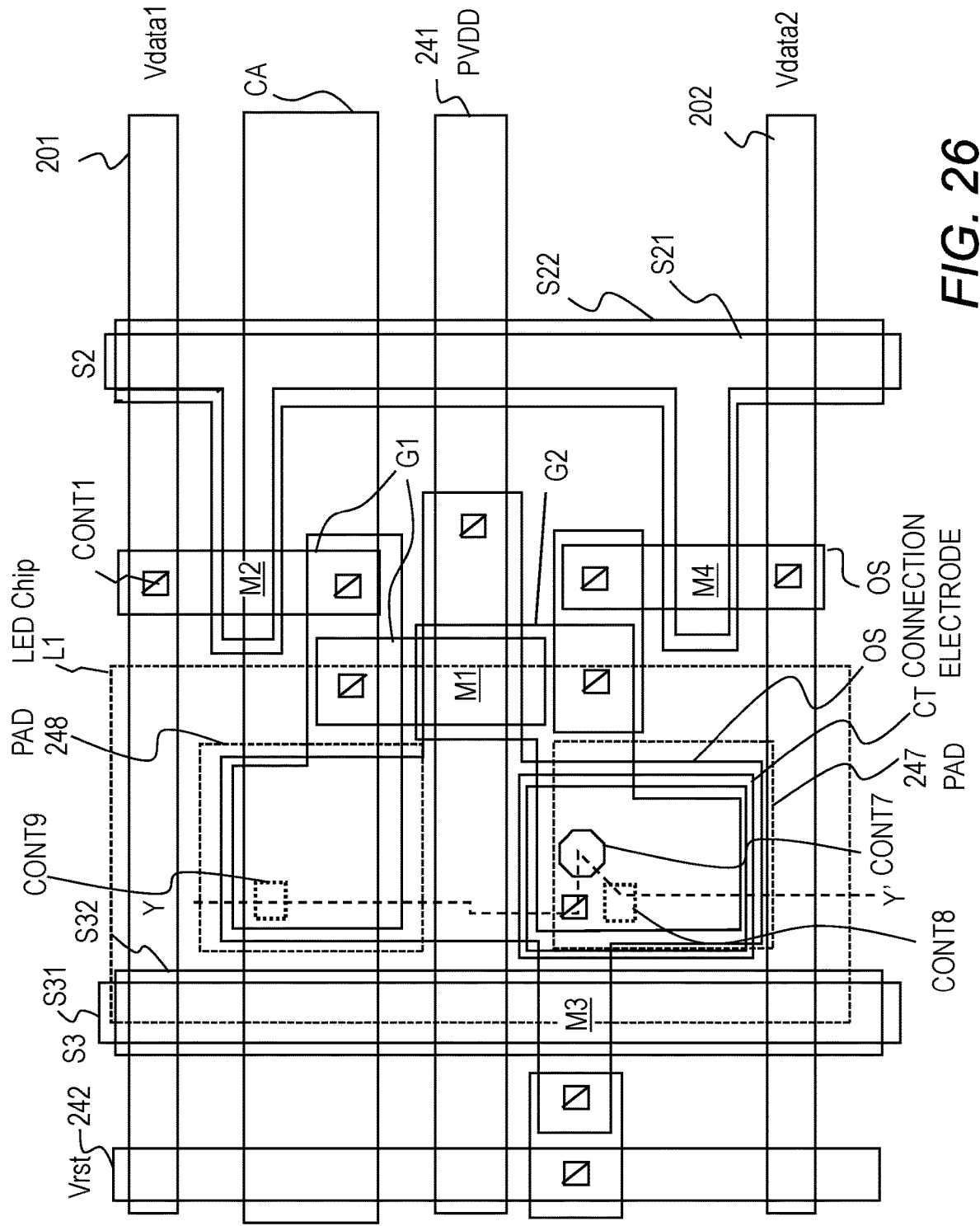
FIG. 26 is a plan diagram schematically illustrating an example of the structure of a micro-LED pixel circuit.
Figure 27:
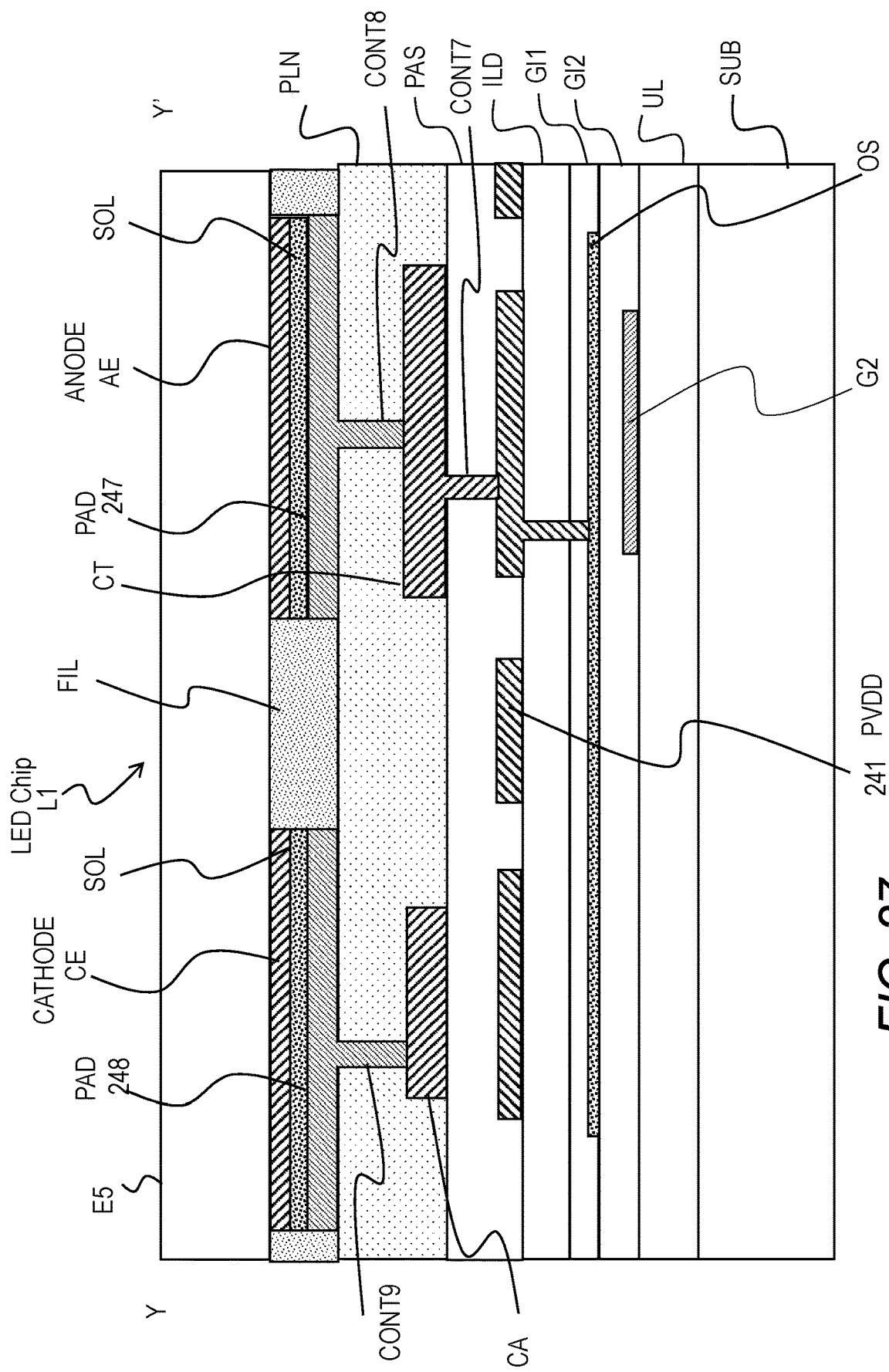
FIG. 27 is a cross-sectional diagram along the section line Y-Y' in FIG. 26.

FIG. 26 is a plan diagram schematically illustrating an example of the structure of a micro-LED pixel circuit. FIG. 27 is a cross-sectional diagram along the section line Y-Y' in FIG. 26. In FIG. 26, the transmission lines S31 and S32 are to transmit the selection signal S3. The transmission lines S21 and S22 are to transmit the selection signal S2. The cathode line CA is provided on the TFT substrate. The TFT substrate and the LED chip L1 are electrically connected by the pads 247 and 248 provided on the TFT substrate.

With reference to FIG. 27, the contact region CONT7 interconnects a connection electrode CT, source/drain regions of the transistors M1 and M3, and a conductive region. The contact region CONT8 interconnects the pad 247 and the connection electrode CT. The contact region CONT9 interconnects the pad 248 and the cathode line CA.

The LED chip L1 includes an anode AE, a cathode CE and a light-emitting layer E5 covering those. The anode AE and the cathode CE are physically and electrically connected to the pads 247 and 248, respectively, through solder SOL.

The cathode line CA is provided between the insulating substrate SUB of the TFT substrate and the LED chip L1.

The LED chip L1 is electrically connected to the pixel circuit through the pads 247 and 248. Patterned anisotropic conductive films (ACF) or soldering can be used for the connection. The gaps where the pads are not provided are filled with resin FIL.

Figure 28:
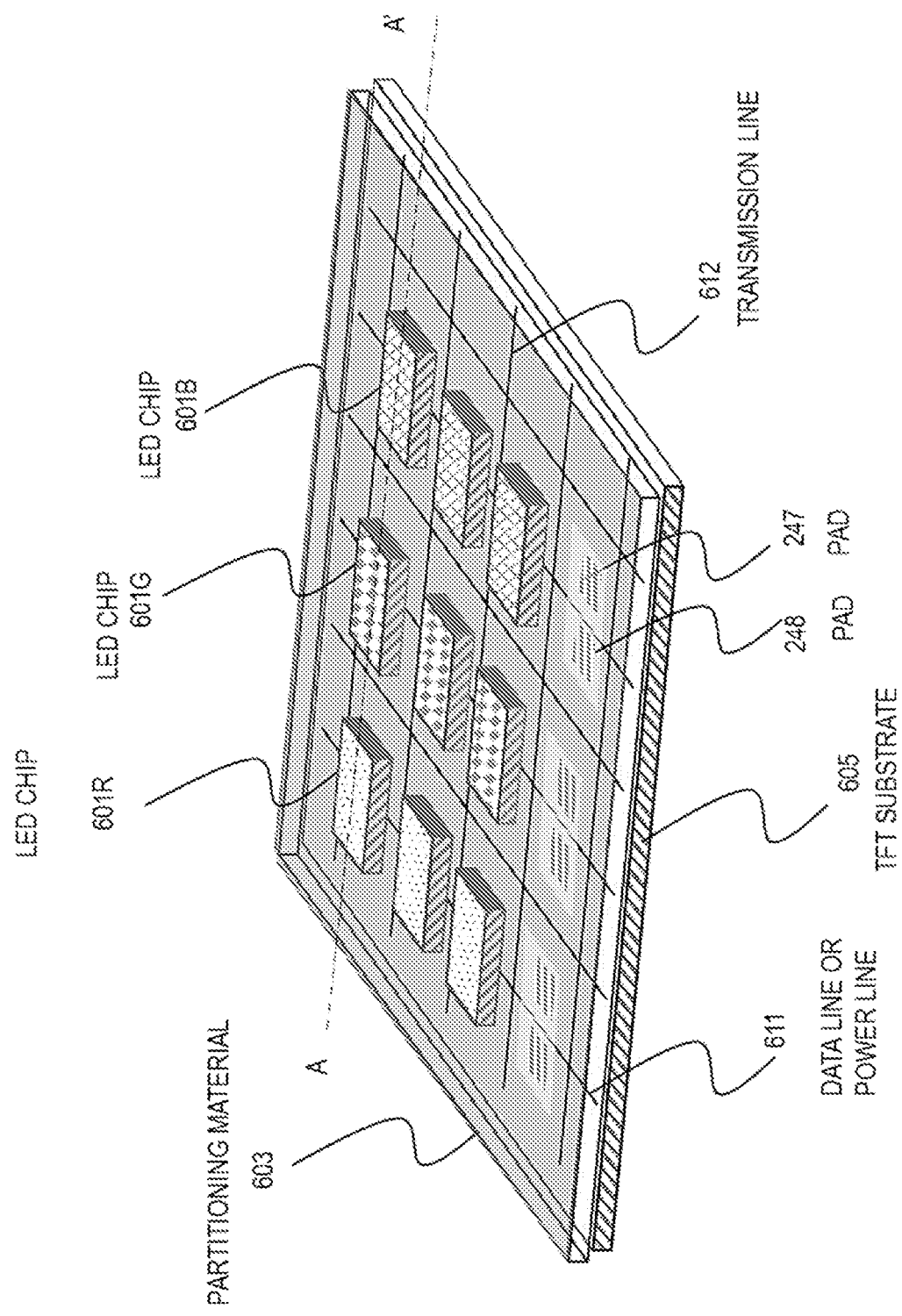
FIG. 28 is a perspective diagram schematically illustrating a display region of a micro-LED display device.
Figure 29:
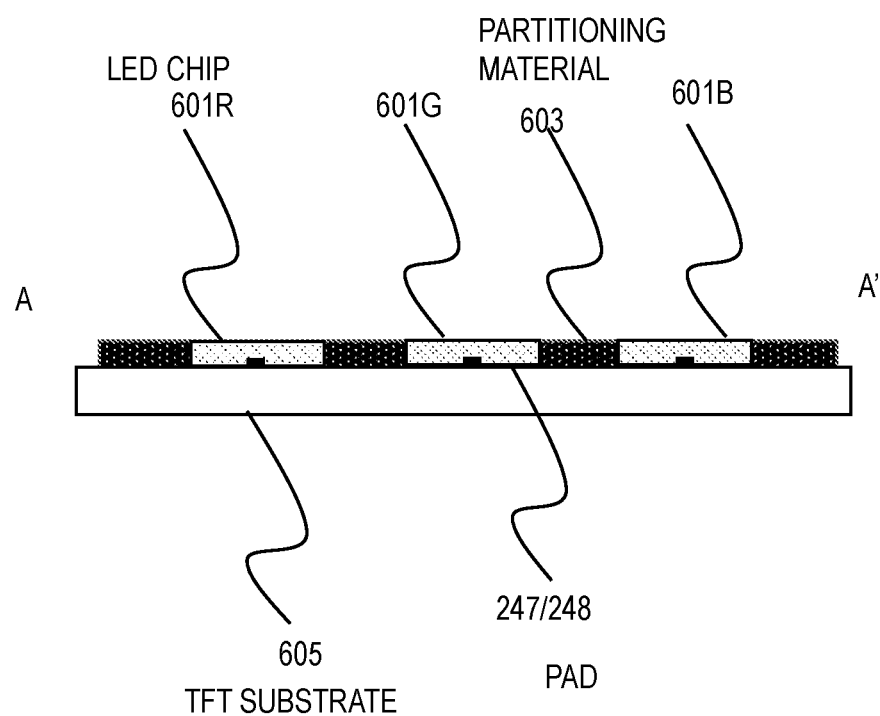
FIG. 29 is a cross-sectional diagram along the section line A-A' in FIG. 28.

FIG. 28 is a perspective diagram schematically illustrating a display region of a micro-LED display device. Red LED chips 601R, green LED chips 601G, and blue LED chips 601B are disposed in a matrix on a TFT substrate 605. FIG. 28 also includes data or power lines 611 and transmission lines 612. Pads 247 and 248, which are exposed when the LED chips are removed, are shown for explanation. FIG. 29 is a cross-sectional diagram along the section line A-A' in FIG. 28. The regions between LED chips 601R, 601G, and 601B mounted on the TFT substrate 605 are filled with partitioning material 603. The partitioning material 603 is black material such as black resin to reduce the surface reflectance.

Figure 30:
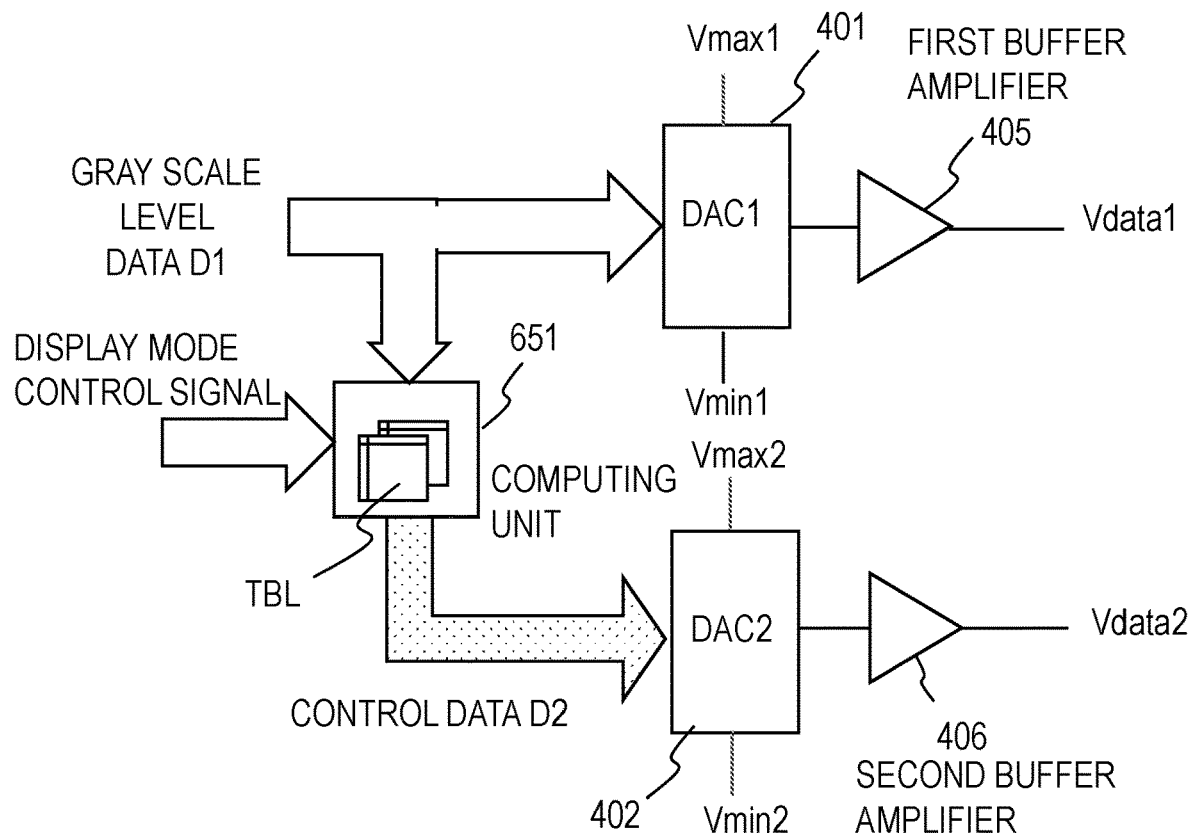
FIG. 30 illustrates an example of a data driver.

FIG. 30 illustrates an example of a data driver. Described here is an example of controlling the gray scale level characteristic by supplying the same gray scale level voltage Vdata1 to all pixels and different control voltages Vdata2 to individual pixels. A computing unit 651 determines whether to apply the standard characteristic or the HDR characteristic in units of pixels in accordance with a display mode control signal and consults a predefined conversion table TBL with gray scale level data D1 to generate control data D2.

Different conversion tables TBL are provided for individual display modes and each table specifies the relation between gray scale level data D1 and control data D2. It defines the functional relation shown in FIG. 22 or 23 in digital fashion.

The first DA converter 401 is supplied with a highest potential Vmax1 and a lowest potential Vmin1 for D/A conversion. The second DA converter 402 is supplied with a highest potential Vmax2 and a lowest potential Vmin2. The first DA converter 401 outputs a gray scale level voltage Vdata1 in accordance with the input gray scale level data D1. The second DA converter 402 outputs control voltages Vdata2 in accordance with the input control data D2.

Figure 31:
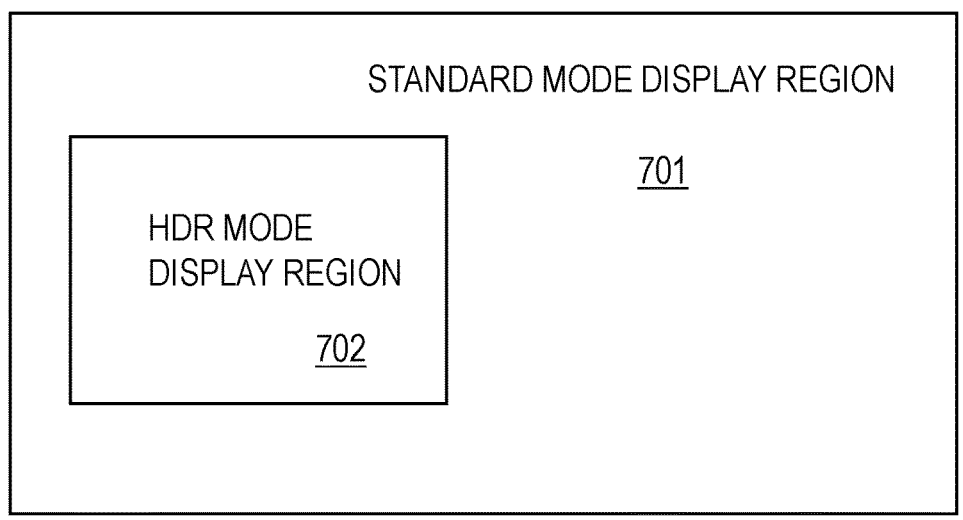
FIG. 31 illustrates a displayed image to include areas having different emission level characteristics together.

Combining a TFT substrate employing the driving method according to an embodiment of this specification and highly reliable micro-LEDs attains an electroluminescent display device having a wide dynamic range of luminosity. Furthermore, such combination enables a displayed image to include areas having different gray scale level characteristics together, like the standard mode display region 701 and the HDR mode display region 702 illustrated in FIG. 31.

As set forth above, embodiments of this disclosure have been described; however, this disclosure is not limited to the foregoing embodiments. Those skilled in the art can easily modify, add, or convert each element in the foregoing embodiments within the scope of this disclosure. A part of the configuration of one embodiment can be replaced with a configuration of another embodiment or a configuration of an embodiment can be incorporated into a configuration of another embodiment.

What is claimed is:

1. A display device comprising:
   a display panel; and
   a control circuit configured to control the display panel, wherein the display panel includes:
   a plurality of light-emitting elements and a plurality of pixel circuits, each pixel circuit being configured to control light emission of a light-emitting element;
   first data lines to supply first data signals to the plurality of pixel circuits;
   second data lines to supply second data signals to the plurality of pixel circuits; and
   scanning lines to control the plurality of pixel circuits, wherein each pixel circuit is connected to one or more scanning lines and includes:
   a driving transistor including a first gate electrode facing a semiconductor layer across a first gate insulating layer and a second gate electrode facing the semiconductor layer across a second gate insulating layer, the driving transistor being configured to control driving current to be supplied to the light-emitting element;
   a first switching transistor connected to a first data line and the first gate electrode, the first switching transistor being controlled to be ON or OFF in accordance with a scanning signal supplied to a scanning line; and
   a second switching transistor connected to a second data line and the second gate electrode, the second switching transistor being controlled to be ON or OFF in accordance with the scanning signal supplied to the scanning line, and
   wherein the control circuit is configured to:
   supply a first data signal to the first gate electrode through the first data line when the first switching transistor is ON and subsequently turn off the first switching transistor;
   supply a second data signal to the second gate electrode through the second data line when the second switching transistor is ON and subsequently turn off the second switching transistor;
   control the first data signal and the second data signal supplied to each pixel circuit in such a manner that voltage of the second data signal varies depending on voltage of the first data signal according to a predetermined relationship between the first and second data signal; and
   control the first data signal and the second data signal in such a manner that the voltage of the second data signal varies in the opposite direction to a variation of the voltage of the first data signal for at least a part of a gray scale range of the light-emitting element from the lowest gray scale level to the highest gray scale level, the part of the gray scale range including the lowest gray scale level.

2. The display device according to claim 1, wherein the driving transistor is an n-type thin-film transistor, and wherein each pixel circuit further includes:
   a first capacitive element connected between the first gate electrode and a source region of the driving transistor; and
   a second capacitive element connected between the second gate electrode and the source region of the driving transistor.

3. The display device according to claim 2, wherein the driving transistor is an oxide semiconductor thin-film transistor.

4. The display device according to claim 2, wherein each pixel circuit further includes a third capacitive element connected between the first gate electrode and a drain region of the driving transistor.

5. The display device according to claim 4, wherein each pixel circuit further includes a fourth capacitive element connected between the second gate electrode and the drain region of the driving transistor.

6. The display device according to claim 5, wherein the fourth capacitive element has a smaller capacitance than the third capacitive element.

7. The display device according to claim 1, wherein the control circuit is configured to generate the second data signal based on the first data signal and a display mode control signal.

8. The display device according to claim 1, wherein the light-emitting element is an inorganic LED or an organic LED.

9. A display device comprising:
a display panel; and
a control circuit configured to control the display panel,
wherein the display panel includes:
   a plurality of light-emitting elements and a plurality of pixel circuits, each pixel circuit being configured to control light emission of a light-emitting element;
   data lines to supply first data signals and second data signals to the plurality of pixel circuits; and
   first scanning lines and second scanning lines to control the plurality of pixel circuits,
wherein each pixel circuit includes:
   a driving transistor including a first gate electrode facing a semiconductor layer across a first gate insulating layer and a second gate electrode facing the semiconductor layer across a second gate insulating layer, the driving transistor being configured to control driving current to be supplied to the light-emitting element;
   a first switching transistor connected to a data line and the first gate electrode, the first switching transistor being controlled to be ON or OFF in accordance with a first scanning signal supplied to a first scanning line; and
   a second switching transistor connected to the data line and the second gate electrode, the second switching transistor being controlled to be ON or OFF in accordance with a second scanning signal supplied to a second scanning line,
wherein the control circuit is configured to:
   supply a first data signal to the first gate electrode through the data line when the first switching transistor is ON and subsequently turn off the first switching transistor;
   supply a second data signal to the second gate electrode through the data line when the second switching transistor is ON and subsequently turn off the second switching transistor; and
   control the first data signal and the second data signal supplied to each pixel circuit in such a manner that voltage of the second data signal varies depending on voltage of the first data signal according to a predetermined relationship between the first and second data signal, and
wherein the control circuit is configured to control the first data signal and the second data signal in such a manner that voltage of the second data signal varies in the opposite direction to variation of voltage of the first data signal for at least a part of a gray scale range of the light-emitting element from the lowest gray scale level to the highest gray scale level, the part of the gray scale range including the lowest gray scale level.

10. The display device according to claim 9,
wherein the driving transistor is an n-type thin-film transistor, and
wherein each pixel circuit further includes:
   a first capacitive element connected between the first gate electrode and a source region of the driving transistor; and
   a second capacitive element connected between the second gate electrode and the source region of the driving transistor.

11. The display device according to claim 9, wherein the control circuit is configured to generate the second data signal based on the first data signal and a display mode control signal.

12. A display device comprising:
a display panel; and
a control circuit configured to control the display panel,
wherein the display panel includes a plurality of light-emitting elements and a plurality of pixel circuits, each pixel circuit being configured to control light emission of a light-emitting element,
wherein each pixel circuit includes a driving transistor configured to control driving current to be supplied to a light-emitting element,
wherein the driving transistor includes a first gate electrode facing a semiconductor layer across a first gate insulating layer and a second gate electrode facing the semiconductor layer across a second gate insulating layer,
wherein the driving transistor is configured to control driving current to be supplied to the light-emitting element in a state where the first gate electrode is supplied with a first data signal in accordance with gray scale level data and the second gate electrode is supplied with a second data signal in accordance with control data generated from the gray scale level data,
wherein the control circuit is configured to control each pixel circuit with a display mode selected from a plurality of display modes,
wherein the plurality of display modes are defined by different relations between the first data signal and the second data signal and by different relations between the first data signal and a brightness level of the light-emitting element, and
wherein the control circuit is configured to control the first data signal and the second data signal to generate the driving current of each pixel circuit.

13. The display device according to claim 12, wherein a relation between video data and the first data signal is common to the plurality of display modes.

14. The display device according to claim 13, wherein voltage of the second data signal varies in the opposite direction to variation of voltage of the first data signal in at least a part of a gray scale range of the light-emitting element from the lowest gray scale level to the highest gray scale level, the part of the gray scale range including the lowest gray scale level.

15. The display device according to claim 13, wherein voltage of the second data signal varies in a super linear fashion with respect to variation of voltage of the first data signal in at least a part of a gray scale range of the light-emitting element from the lowest gray scale level to the highest gray scale level, the part of the gray scale range including the highest gray scale level.

16. The display device according to claim 12, wherein voltage of the second data signal varies in the opposite direction to variation of voltage of the first data signal in at least a part of a gray scale range of the light-emitting element from the lowest gray scale level to the highest gray scale level, the part of the gray scale range including the lowest gray scale level.

17. The display device according to claim 12, wherein voltage of the second data signal varies in a super linear fashion with respect to variation of voltage of the first data signal in at least a part of a gray scale range of the light-emitting element from the lowest gray scale level to the highest gray scale level, the part of the gray scale range including the highest gray scale level.

18. The display device according to claim 12, wherein the control circuit is configured to generate the second data signal based on the first data signal and a display mode control signal.

* * * * *